United States Patent
Xu et al.

(10) Patent No.: US 11,735,537 B2
(45) Date of Patent: Aug. 22, 2023

(54) METHODS TO EMBED MAGNETIC MATERIAL AS FIRST LAYER ON CORELESS SUBSTRATES AND CORRESPONDING STRUCTURES

(71) Applicant: Intel Corporation, Santa Clara, CA (US)

(72) Inventors: Cheng Xu, Chandler, AZ (US); Kyu-Oh Lee, Chandler, AZ (US); Junnan Zhao, Gilbert, AZ (US); Rahul Jain, Gilbert, AZ (US); Ji Yong Park, Chandler, AZ (US); Sai Vadlamani, Gilbert, AZ (US); Seo Young Kim, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/852,003

(22) Filed: Jun. 28, 2022

(65) Prior Publication Data
US 2022/0328431 A1    Oct. 13, 2022

Related U.S. Application Data

(62) Division of application No. 15/938,114, filed on Mar. 28, 2018, now Pat. No. 11,417,614.

(51) Int. Cl.
*H01L 23/64* (2006.01)
*H01L 23/498* (2006.01)
*H01L 23/00* (2006.01)
*H01L 21/48* (2006.01)

(52) U.S. Cl.
CPC ........ *H01L 23/645* (2013.01); *H01L 21/4857* (2013.01); *H01L 23/49822* (2013.01); *H01L 23/49838* (2013.01); *H01L 24/16* (2013.01); *H01L 2224/16225* (2013.01)

(58) Field of Classification Search
CPC ............ H01L 2017/0066; H01L 28/10; H01L 23/645; H01L 23/49838–49844; H01L 23/31–3192; H01L 2224/1605–16059; H01L 2224/1301–13019; H01F 17/02–03
See application file for complete search history.

(56) References Cited

U.S. PATENT DOCUMENTS 6,310,386 B1    10/2001    Shenoy
2010/0283570 A1    11/2010    Lavoie

*Primary Examiner* — Amar Movva
(74) *Attorney, Agent, or Firm* — Schwabe, Williamson & Wyatt P.C.

(57) ABSTRACT

Embodiments include an electronic package that includes a first layer that comprises a dielectric material and a second layer over the first layer, where the second layer comprises a magnetic material. In an embodiment, a third layer is formed over the second layer, where the third layer comprises a dielectric material. In an embodiment, the third layer entirely covers a first surface of the second layer. In an embodiment a first conductive layer and a second conductive layer are embedded within the second layer. In an embodiment, sidewalls of the first conductive layer and the second conductive layer are substantially vertical.

23 Claims, 20 Drawing Sheets

METHODS TO EMBED MAGNETIC
MATERIAL AS FIRST LAYER ON
CORELESS SUBSTRATES AND
CORRESPONDING STRUCTURES

CROSS-REFERENCE TO RELATED APPLICATIONS

This application is a division of U.S. patent application Ser. No. 15/938,114, filed Mar. 28, 2018, the entire contents of which is hereby incorporated by reference herein.

TECHNICAL FIELD

Embodiments of the present disclosure relate electronics packaging, and more particularly, to electronic packaging with embedded magnetic layers.

BACKGROUND

Improvement in power delivery is needed in packaging architectures in order to meet increasingly demanding electrical requirements. Furthermore, the improvement in power delivery needs to be implemented without increasing the form factor (e.g., the Z-height) of packages. One way to obtain the desired improvements in power delivery is by utilizing magnetic materials on coreless substrates.

However, substrate manufacturing process used today for integrating magnetic material into the package lead to interactions with wet chemistries such as desmear, electroless plating, flash etch, soft etch, surface finishes, and the like. In particular, processing environments interact negatively with the magnetic fillers (e.g., Fe fillers). For example, the processing environment may interact with the magnetic materials and result in corrosion. Additionally, the magnetic fillers may leach into the chemistry bath and reduce the bath life and chemistry performance.

In some current processing flows that integrate magnetic materials into the package, the magnetic material is formed last to avoid some of the above mentioned issues. However, with a magnetic materials last approach, solder resist lamination needs to be done after dummy core detach. This is problematic because substrate suppliers need a dedicated tool and capital expenditure investment to enable solder resist lamination after dummy core detach. Also, tool purchase and installation would bring schedule risk to new products.

EMBODIMENTS OF THE PRESENT DISCLOSURE

Described herein are electronic packages with magnetic materials and methods of forming such packages. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As noted above, the inclusion of magnetic materials in the manufacture of organic packages is currently problematic due to the leaching of magnetic materials (e.g., iron, alloys containing iron, and other ferromagnetic particles or elements) into processing baths and corrosion. Accordingly, it is presently not feasible to integrate components, such as inductors, that benefit from the use of magnetic materials into organic substrates.

However, embodiments described herein provide processing methods that allow for the integration of magnetic materials with currently available processing techniques. Particularly, embodiments include embedding magnetic materials so that the magnetic materials are not exposed to processing environments where the leaching of magnetic materials is detrimental. For example, embodiments include embedding the magnetic materials so that the magnetic materials are not exposed to processing environments that have chemistries that may be negatively altered by leached magnetic materials, such as electroless baths, desmear baths, subtractive etching baths and the like. Since the magnetic material is isolated from such environments, there is no need to redesign the chemistries of processing baths or provide dedicated processing baths to handle the magnetic materials.

Furthermore, isolating the magnetic material allows for subsequent changes to the magnetic material to be made without needing to adjust the chemistries of processing environments. This allows for quicker design times and reduces the cost of development. Additionally, embodiments allow for reduced capital expenditures because the solder resist layer may be formed prior to dummy core removal or after the dummy core removal.

Figure 1:
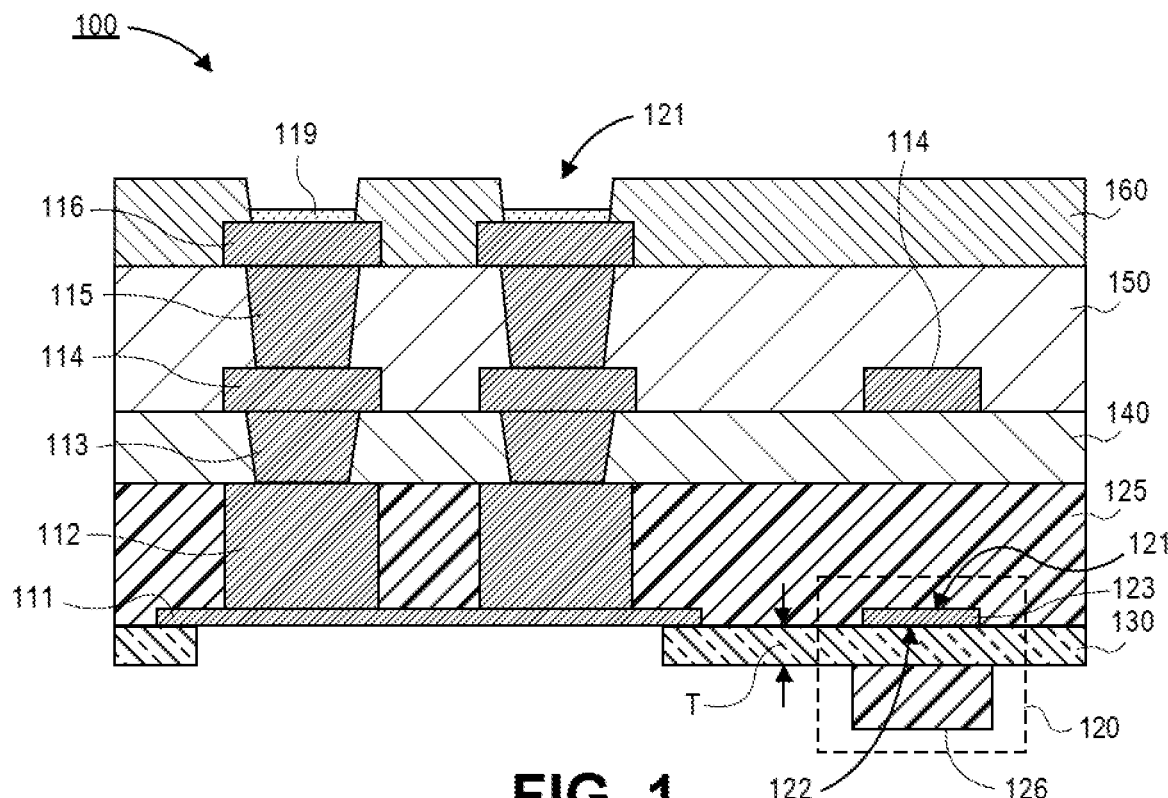
FIG. 1 is a cross-sectional illustration of a package with an embedded magnetic layer, where the solder resist is applied before a dummy core is removed, in accordance with an embodiment.

Referring now to FIG. 1, a cross-sectional illustration of an electronic package 100 is shown, in accordance with an embodiment. In an embodiment, the package 100 may include a plurality of dielectric layers and conductive layers. In an embodiment, the package 100 may be a coreless package. In an embodiment, the electronic package 100 may include a first layer 130. The first layer 130 may comprise a dielectric layer. In a particular embodiment, the first layer 130 may be a photoimageable dielectric (PID). In order to provide improved functionality of integrated passive devices, the first layer 130 may have a thickness T that is minimized. In an embodiment, the thickness T may be 10 μm or less. In some embodiments, the thickness T may be 5 μm or less.

In an embodiment, the first layer 130 may directly support a first conductive layer 111. The first conductive layer 111 may include conductive traces such as copper traces. In an embodiment, the first conductive layer 111 may also include traces 123 used for passive devices, as will be described below. In an embodiment, a second conductive layer 112 may be formed over the first conductive layer 111. The second conductive layer 112 may include a plurality of conductive pillars, such as copper pillars. The conductive layer 112 may electrically couple the first conductive layer 111 to other conductive layers in the package 100.

In an embodiment, the first layer 130 may also support a second layer 125. In an embodiment, the second layer 125 may comprise a magnetic material. For example, the second layer 125 may comprise a dielectric material with magnetic filler particles, such as iron filler particles. In an embodiment, the magnetic material may be a cured liquid with magnetic filler particles or a laminated film with magnetic filler particles.

As noted above, the presence of the magnetic materials in the second layer 125 is problematic for currently available processing environments used in electronic packaging. Accordingly, the first conductive layer 111 and the second conductive layer 112 may be formed with lithography processes prior to second layer 125 being formed over the first layer 130. As such, the patterning and deposition processes needed to form the first conductive layer 111 and the second conductive layer 112 are implemented without the presence of the magnetic material in the second layer 125. Furthermore, since the first conductive layer 111 and the second conductive layer 112 are formed with photolithography processes, sidewalls of the first conductive layer 111 and the second conductive layer 112 may be substantially vertical. As used herein, substantially vertical may refer to a surface that is within +/−5° from being orthogonal to an underlying surface.

In an embodiment, a third layer 140 may be formed over a surface of the second layer 125. The third layer 140 may comprise a dielectric material. In an embodiment, the third layer is in direct contact with the second layer 125 and portions of the second conductive layer 112. The third layer 140 may be formed over the second layer 125 with a process that does not expose the second layer 125 to a bath. For example, the third layer 140 may be laminated over the second layer 125. The third layer 140 may be considered a barrier layer since it protects the magnetic material of the second layer 125 from subsequent processing operations.

In an embodiment, a third conductive layer 113 may be formed through the third layer 140. The third conductive layer 113 may include vias formed through the third layer 140. In an embodiment, the vias may be formed with a lithography process or with laser drilling. It is to be appreciated that the plating and/or desmear used to form the third conductive layer 113 do not contact the magnetic second layer 125 since the third layer 140 protects the magnetic second layer 125 from the processing environments used to form the third conductor layer 113.

Additional embodiments may include a fourth layer 150 formed over the third layer 140. In an embodiment, the fourth layer 150 may comprise a dielectric material. A fourth conductive layer 114 and a fifth conductive layer 115 may be formed in the fourth layer 150. Embodiments may include a fourth conductive layer 114 that includes a plurality of traces and pads, and a fifth conductive layer 115 that includes vias. Since the magnetic second layer 125 is protected by the third layer 140, the magnetic material is not exposed to the processing environments used to form the fourth and fifth conductive layers 114 and 115.

In an embodiment, a sixth conductive layer 116 may be formed over the fourth layer 150. A solder resist layer 160 may be formed over the fourth layer 150 and the sixth conductive layer 116. In an embodiment, openings 121 may be formed into the solder resist layer 160 to expose the sixth layer 116. As is known in the art, surface treatment and/or protection layers 119 may be formed over surfaces the sixth conductive layer 116 exposed by the openings 121. While the solder resist layer 160 is shown as being formed over the fourth layer 150, it is to be appreciated that the electronic package 100 may include any number of dielectric layers and conductive layers between the magnetic second layer 125 and the solder resist layer 160.

In an embodiment, the conductive layers and the magnetic layers may be configured to form passive elements. For example, electronic package 100 may include an inductor 120. In an embodiment, the inductor 120 may include an inductor trace 123 that is surrounded by a magnetic material. The inductor trace 123 may be formed as part of the first conductive layer 111. The magnetic material may surrounding the inductor trace 123 may include the second layer 125 and a magnetic block 126. In an embodiment, the second layer 125 may be in direct contact with inductor trace 123. For example, the second layer 125 may be in direct contact with sidewalls and a first surface 121 of the inductor trace 123. In an embodiment, the magnetic block 126 may be separated from the second surface 122 of the inductor trace 123 by the first layer 130. In an embodiment, the inductor 120 may be a transmission line inductor, a spiral inductor or a solenoid inductor.

Figure 2:
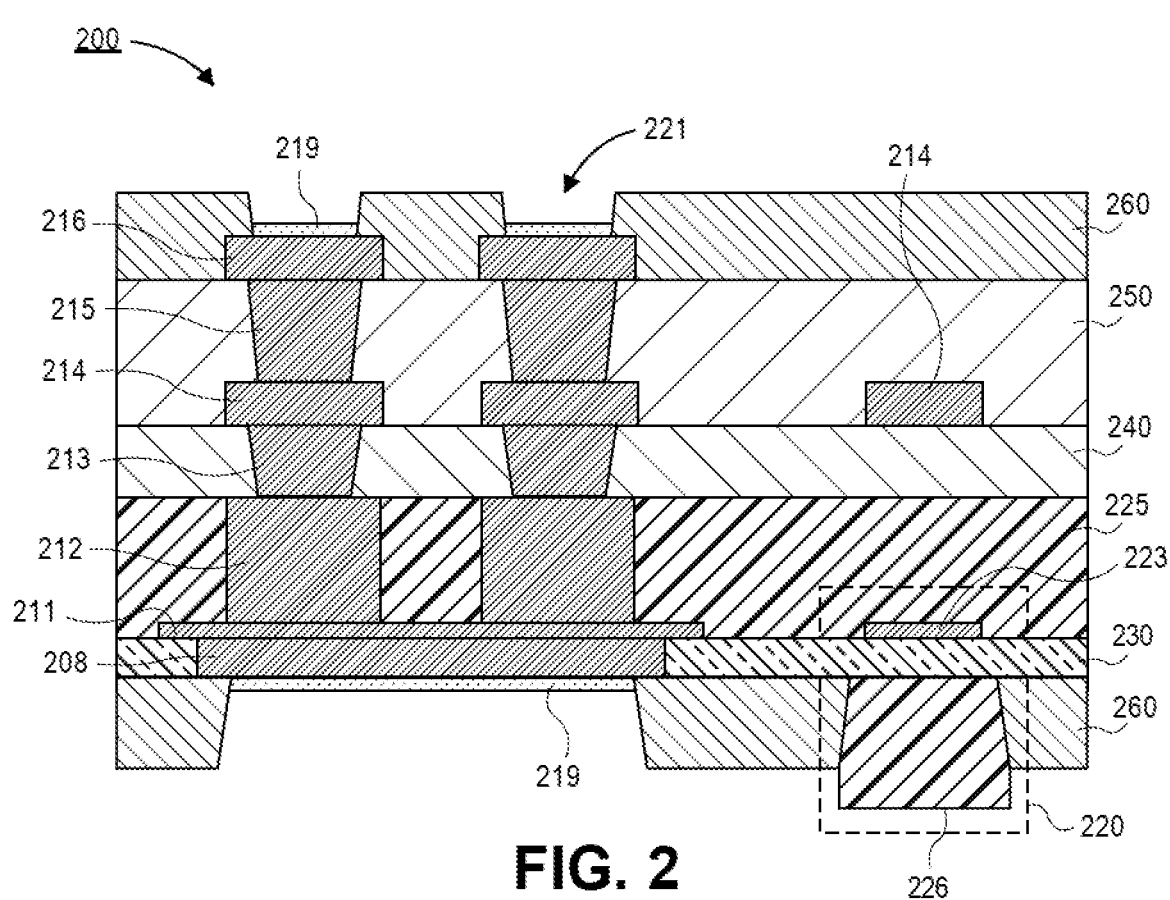
FIG. 2 is a cross-sectional illustration of a package with an embedded magnetic layer, where the solder resist is applied after a dummy core is removed, in accordance with an embodiment.

Referring now to FIG. 2, a cross-sectional illustration of an electronic package 200 is shown, in accordance with an embodiment. The electronic package 200 is substantially similar to the electronic package 100 described above, with the exception that the solder resist layer is formed after a dummy core detach. As illustrated, a second solder resist layer 260 is formed over the first layer 230. In an embodiment, the magnetic block 226 is formed in an opening in the solder resist layer 260. Additionally, a conductive layer 208 is formed through first layer 230. The conductive layer 208 may include a treatment and/or protection layer 219.

Figure 3:
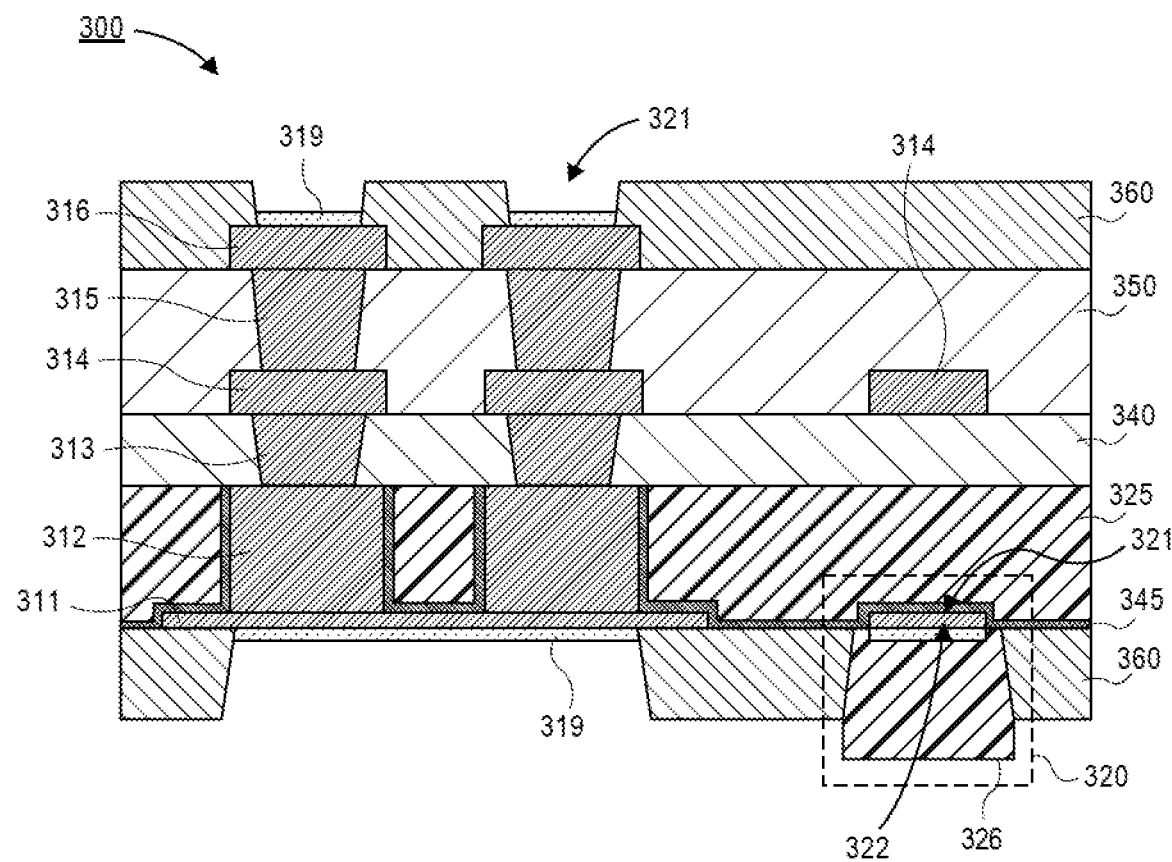
FIG. 3 is a cross-sectional illustration of a package with an embedded magnetic layer, where the magnetic layer is surrounded by a barrier layer, in accordance with an embodiment.

Referring now to FIG. 3, a cross-sectional illustration of an electronic package 300 is shown, in accordance with another embodiment. Electronic package 300 includes a first barrier layer 345 and a second barrier layer 340 surrounding the magnetic layer 325. The inclusion of a first barrier layer 345 allows for the first layer 130/230 described in the previous embodiments to be omitted. In an embodiment, the first barrier layer 345 may comprise a dielectric material. The first barrier layer 345 may be formed along the surfaces of the first conductive layer 311 and the second conductive layer 312. Accordingly, the first barrier layer 345 separates the magnetic layer 325 from the first and second conductive layers 311 and 312. In an embodiment, the second barrier layer 340 is formed over the top surface of the magnetic layer 325. Combined, the first barrier layer 345 and the second barrier layer 340 enclose the magnetic layer 325. As such, the magnetic layer 325 is protected from processing environments that may negatively interact with the magnetic materials of the magnetic layer 325.

Figure 4A:
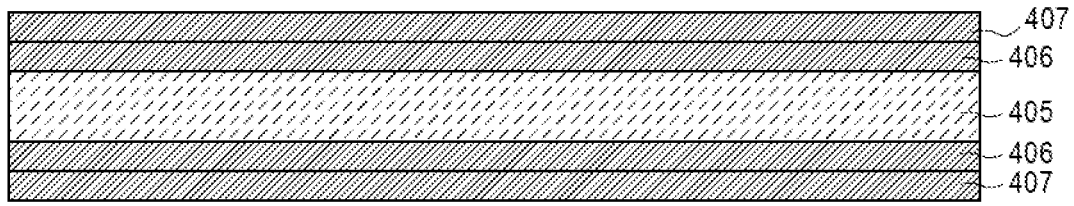
FIG. 4A is cross-sectional illustration of a dummy core, in accordance with an embodiment.

Referring now to FIGS. 4A-4M cross-sectional illustration of a process flow for forming an electronic package with a magnetic layer is shown, in accordance with an embodiment. Referring now to FIG. 4A, a cross-sectional illustration of a dummy core 405 is shown, in accordance with an embodiment. In an embodiment, the dummy core 405 may include first and second films 406 and 407 over both surfaces, as is known in the art.

Figure 4B:
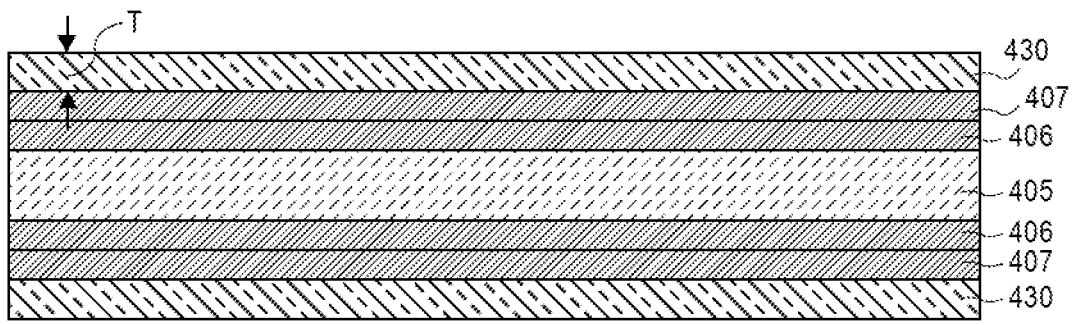
FIG. 4B is a cross-sectional illustration after a photoimageable dielectric (PID) layer is formed over the dummy core, in accordance with an embodiment.

Referring now to FIG. 4B, a cross-sectional illustration of after a first layer 430 is formed over the films 407 is shown, in accordance with an embodiment. In an embodiment, the first layer 430 comprises a dielectric material. In some embodiments, the first layer is a PID. Embodiments include forming the first layer with any suitable process, such as laminating or the like. In an embodiment, the thickness T of the first layer is minimized in order to optimize the performance of subsequently formed passive devices. For example, the thickness T may be 10 μm or less. In some embodiments, the thickness T may be 5 μm or less.

As illustrated in FIG. 4B, the first layer 430 is formed over both surfaces of the dummy core 405. It is to be appreciated that embodiments include forming similar layers over both surfaces of the dummy core. However, only the layers formed over the top surface of the dummy core will be described herein for clarity and simplicity.

Figure 4C:
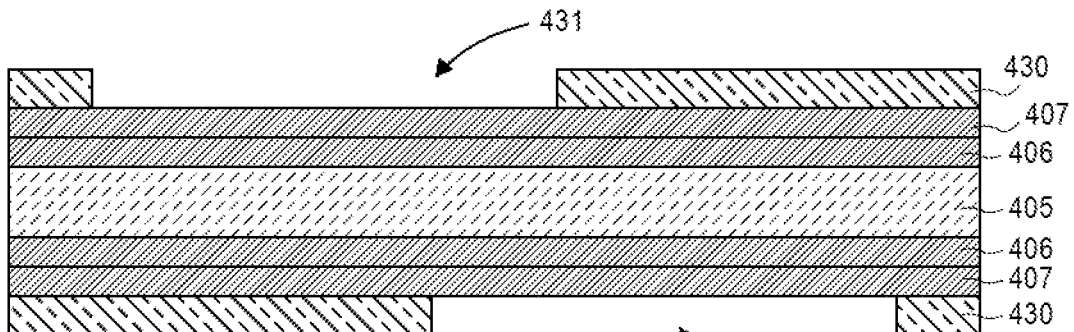
FIG. 4C is a cross-sectional illustration after the PID layer is patterned, in accordance with an embodiment.

Referring now to FIG. 4C, a cross-sectional illustration after the first layer 430 is patterned is shown, in accordance with an embodiment. In an embodiment, the first layer 430 may be patterned to form openings 431 that expose a portion of the film 407. In an embodiment, the first layer may be patterned with a lithography process.

Figure 4D:
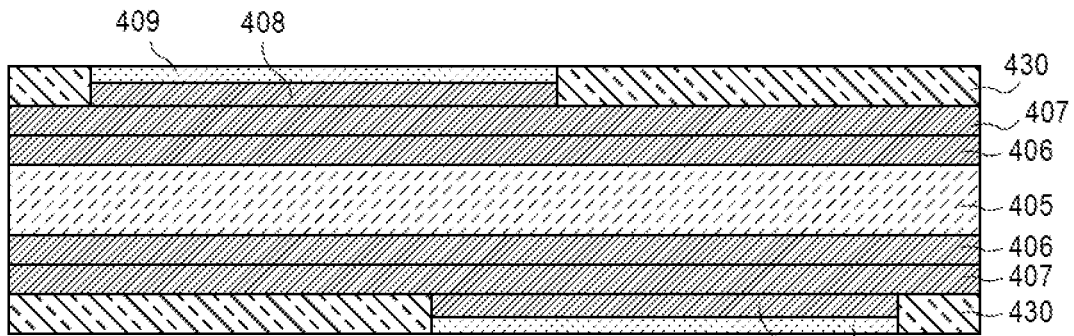
FIG. 4D is a cross-sectional illustration after a pad is formed in the opening defined by the PID layer, in accordance with an embodiment.

Referring now to FIG. 4D, a cross-sectional illustration after an underlying conductive layer 408 is formed in the opening is shown, in accordance with an embodiment. In an embodiment, the underlying conductive layer 408 may be formed with an electrolytic plating process. In an embodiment, one or more additional layers 409, such as a protective layer may also be formed over the underlying layer 408. The combined thickness of the underlying layer 408 and the additional layers 409 may be substantially similar to the thickness T of the first layer 430.

Figure 4E:
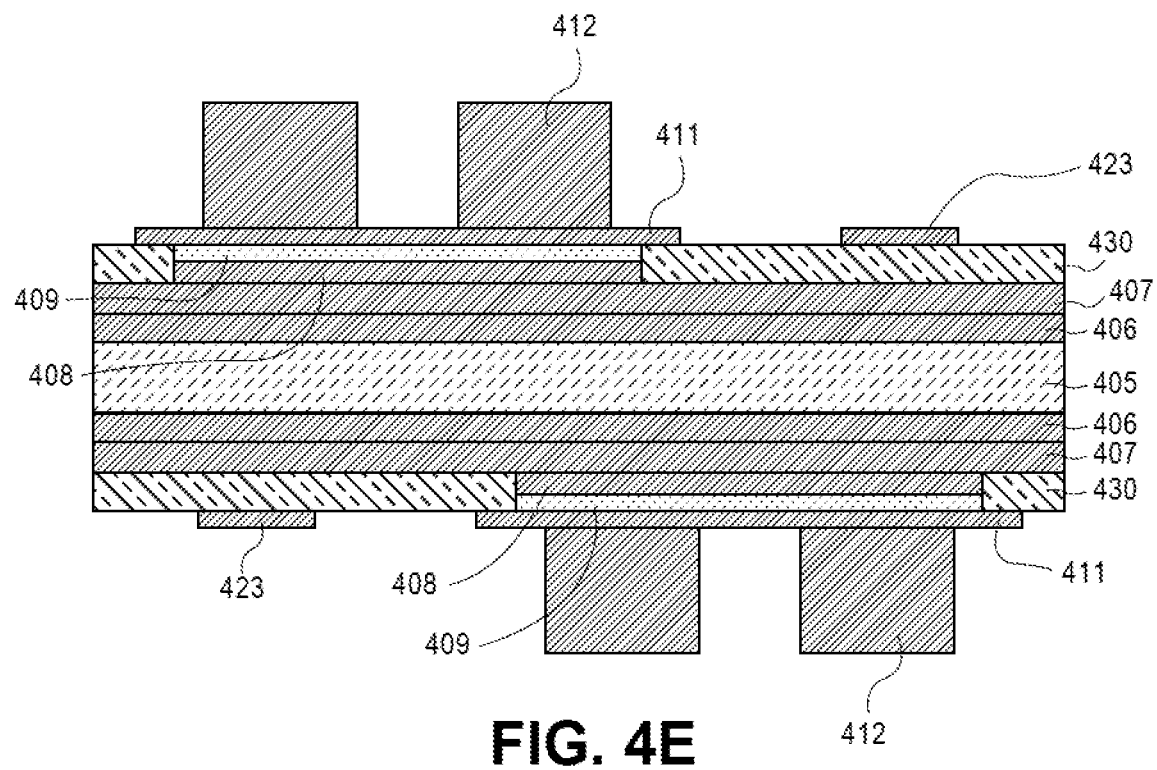
FIG. 4E is a cross-sectional illustration after a first conductive layer and a second conductive layer are formed with a lithography process, in accordance with an embodiment.

Referring now to FIG. 4E, a cross-sectional illustration after a first conductive layer 411 and a second conductive layer 412 is formed is shown, in accordance with an embodiment. In an embodiment, the first and second conductive layers 411 and 412 may be formed with a lithography process. The first conductive layer 411 may include conductive traces and pads. In an embodiment, the first conductive layer 411 may also include conductive features 423 used for passive devices, such as an inductor. In an embodiment, the second conductive layer 412 may be formed over the first conductive layer, and may include conductive pillars. In an embodiment, sidewalls of the first and second conductive layer 411 and 412 may be substantially vertical.

Figure 4F:
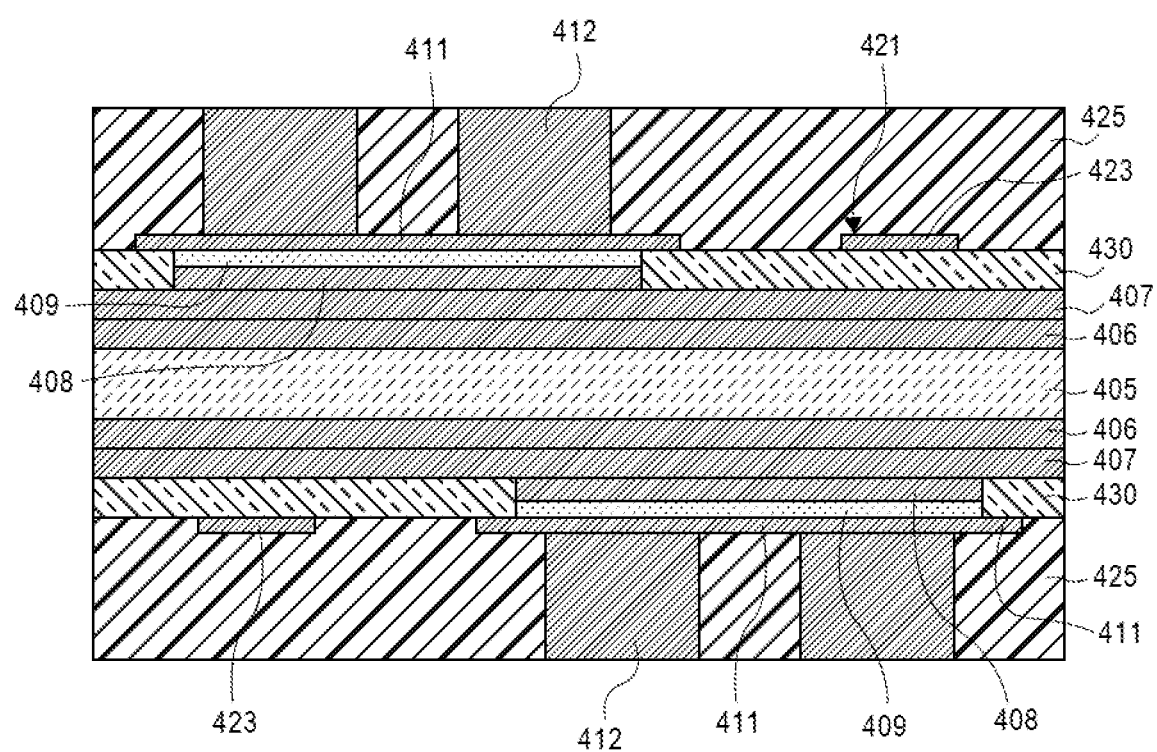
FIG. 4F is a cross-sectional illustration after a magnetic layer is formed over the first conductive layer, the second conductive layer, and the PID layer, in accordance with an embodiment.

Referring now to FIG. 4F, a cross-sectional illustration after a second layer 425 is formed is shown, in accordance with an embodiment. In an embodiment, the second layer 425 may comprise a magnetic material. The second layer 425 may be laminated or the second layer 425 may be a cured liquid. In an embodiment, the second layer may be planarized in order to have a top surface that is substantially coplanar with a top surface of the second conductive layer 412. Embodiments include a second layer 425 that is conformal to the surfaces of the first conductive layer 411 and the second conductive layer 412 and that is in direct contact with portions of the first conductive layer 411 and the second conductive layer 412. In an embodiment, the second layer 425 may be formed over and in direct contact with a first surface 421 of the passive device trace 423 and sidewalls of the passive device trace 423.

Figure 4G:
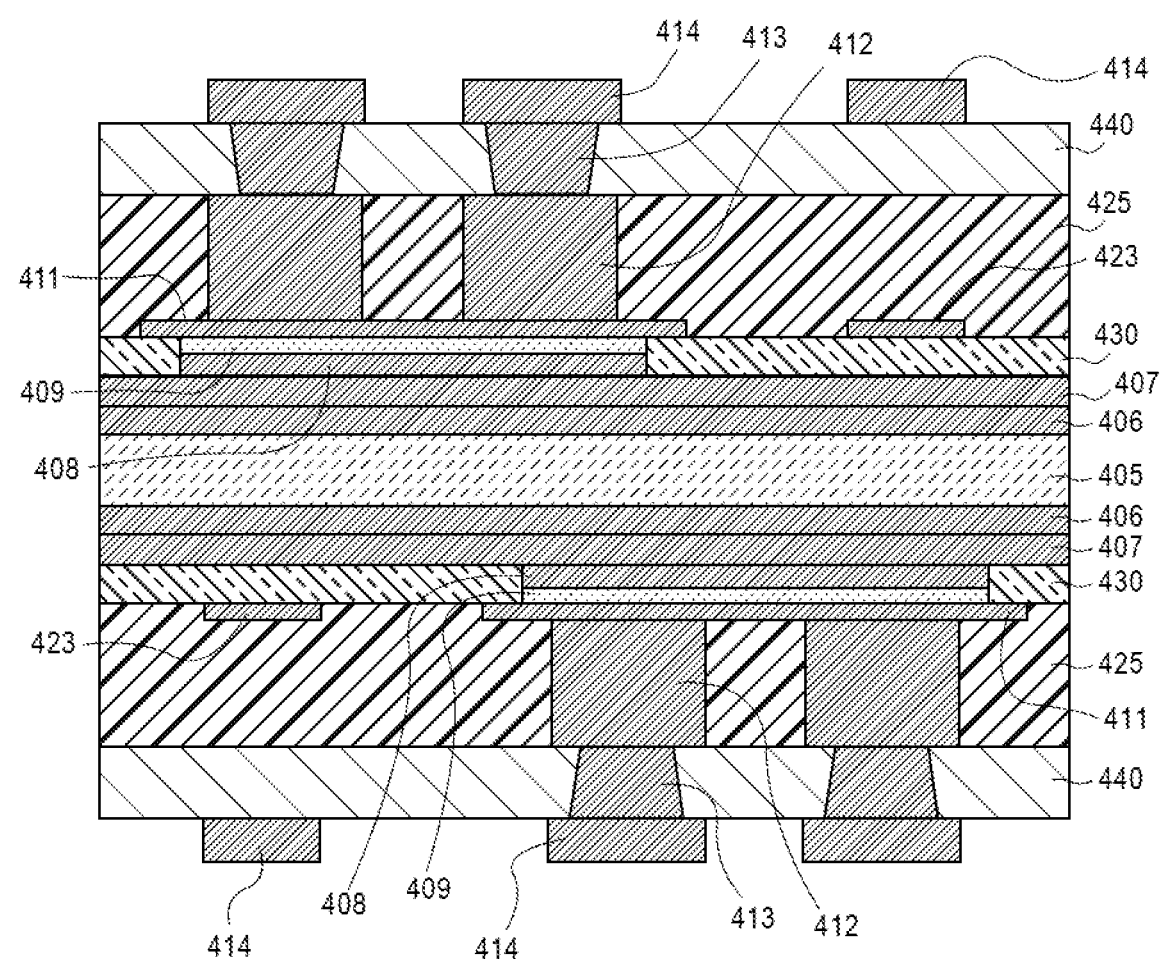
FIG. 4G is a cross-sectional illustration after a barrier layer is formed over a surface of the magnetic layer, in accordance with an embodiment.

Referring now to FIG. 4G, a cross-sectional illustration after a third layer 440 is formed is shown, in accordance with an embodiment. In an embodiment, the third layer 440 may comprise a dielectric material. Some embodiments may include a third layer 440 that is a PID. In an embodiment, the third layer 440 may be formed with a lamination process or any other suitable deposition process. The third layer 440 may be formed over and in direct contact with the magnetic second layer 425. As such, after the formation of the third layer 440, the magnetic second layer 425 is completely embedded and protected from subsequent processing environments. Particularly, embodiments include a magnetic second layer 425 that is in direct contact with the first layer 430, the third layer 440, and surfaces of the first and second conductive layers 411 and 412.

In an embodiment, a third conductive layer 413 may be formed through the third layer 440. For example, the third conductive layer 413 may comprise a plurality of vias. The via openings may be formed with any suitable process, such as laser drilling or photolithography. In embodiments where laser drilling is used, a desmear process may also be needed. However, since the magnetic second layer 425 is protected by the third layer 440, there is no contamination issue, as described above. Similarly, the third conductive layer 413 may be plated (e.g., with an electroless or electrolytic plating process) without contamination issues.

In an embodiment, a fourth conductive layer 414 may be formed over a surface of the third layer 440. The fourth conductive layer 414 may be formed with any suitable processes, such as electroless or electrolytic plating, photolithography processes, or the like. The fourth conductive layer 414 may include conductive traces and pads, such as pads formed over the third conductive layer 413.

Figure 4H:
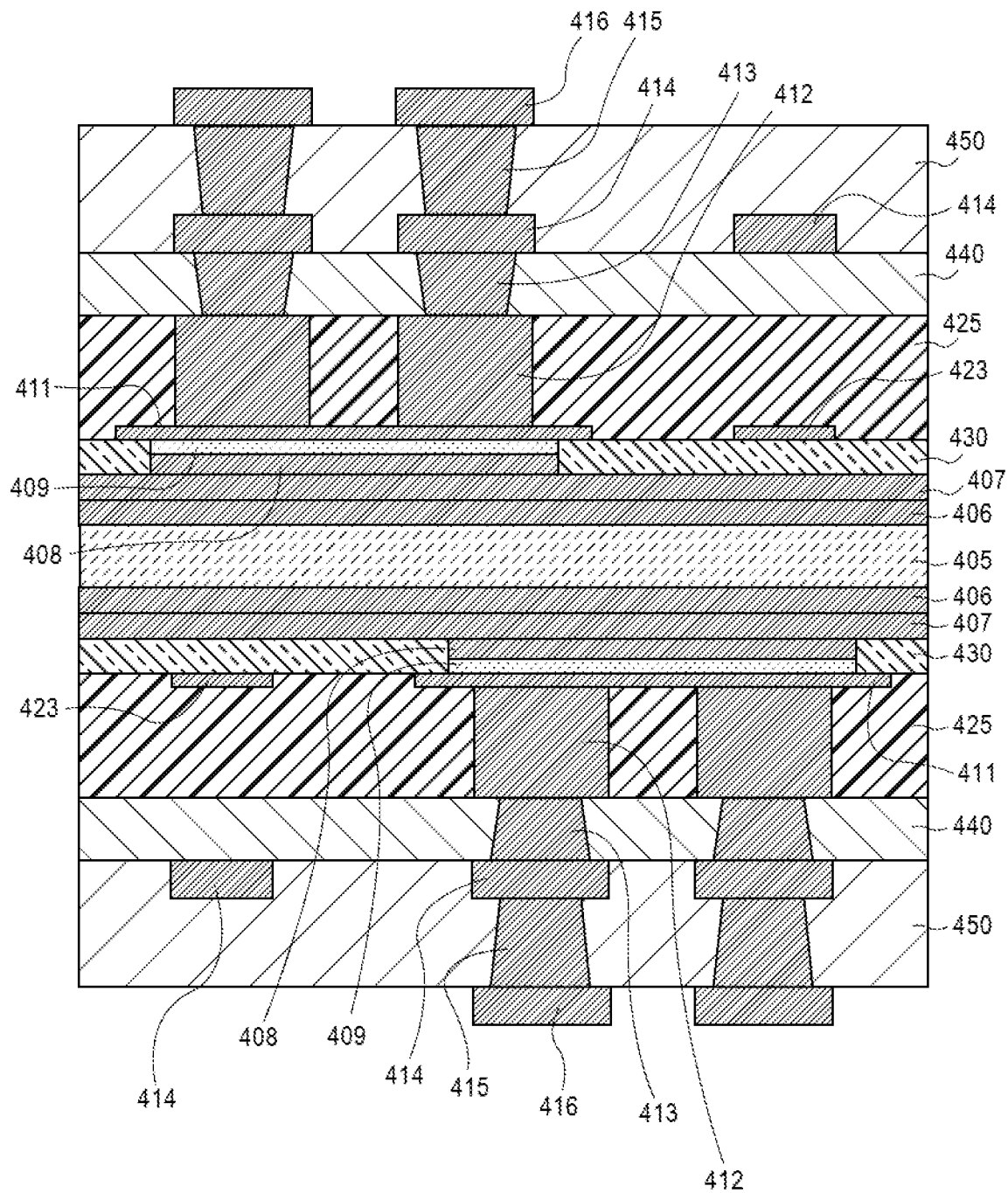
FIG. 4H is a cross-sectional illustration after a dielectric layer is formed over the barrier layer, in accordance with an embodiment.

Referring now to FIG. 4H, a cross-sectional illustration after a fourth layer 450 is formed is shown, in accordance with an embodiment. In an embodiment, the fourth layer 450 may comprise a dielectric material. In an embodiment, the fourth layer 450 may be a different material than the third layer 440. In some embodiments, the fourth layer 450 may be the same material as the third layer 440. Embodiments include forming a fifth conductive layer 415 in the fourth layer 450. The fifth conductive layer 415 may include conductive vias. For example, the fifth conductive layer and the fourth layer 450 may be formed with typical semi-additive processes (SAP), additive processes, or any other suitable process. In an embodiment, a sixth conductive layer 416 may be formed over the top surface of the fourth layer 450. The sixth conductive layer 416 may include conductive pads and traces. The sixth conductive layer may be formed with any suitable process, such as an additive process, a SAP process, or the like. It is to be appreciated that since the magnetic second layer 425 is protected by the third layer 440, there is no contamination issue during the processes used to form the fourth layer 450 or any of the conductive layers.

Figure 4I:
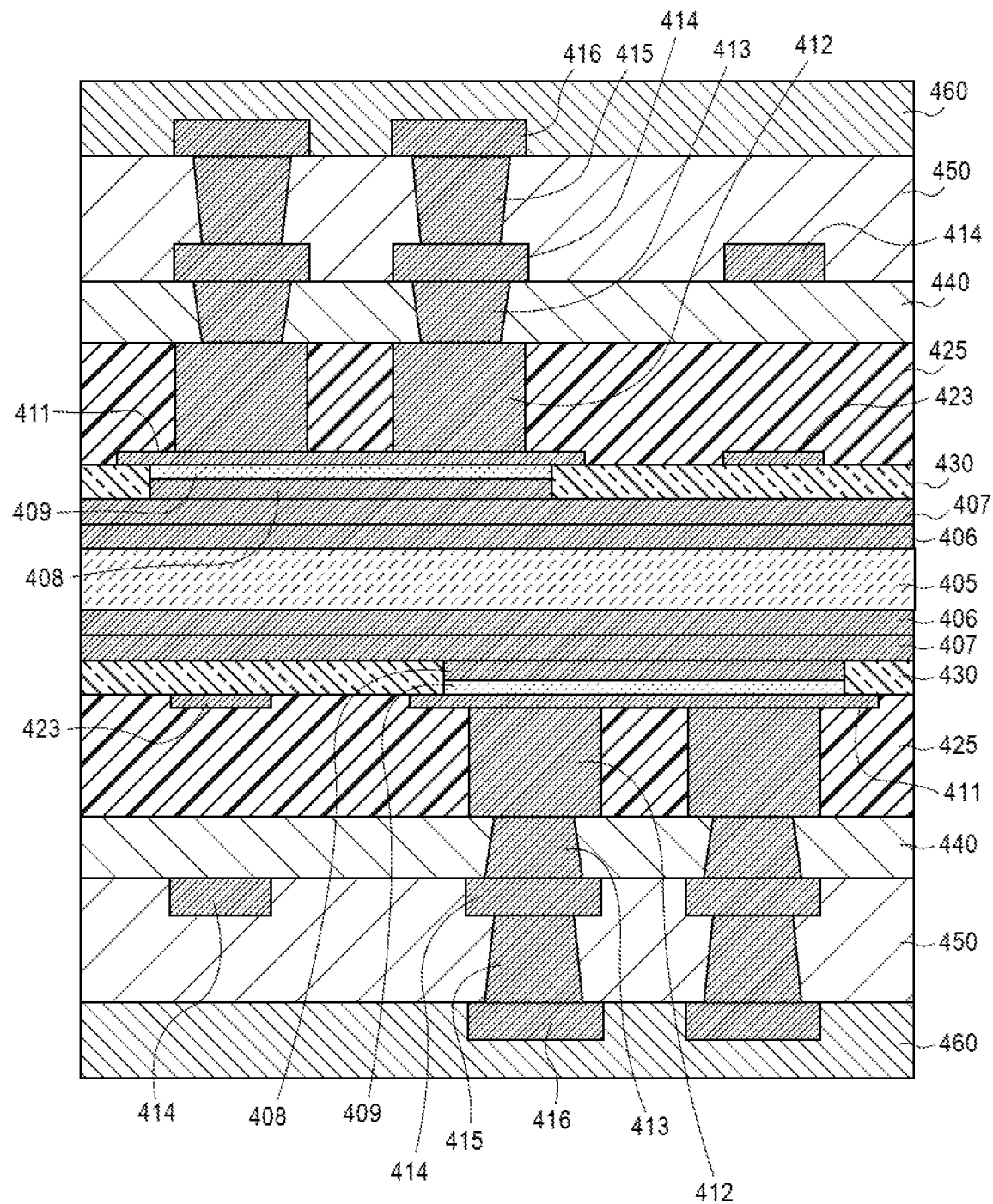
FIG. 4I is a cross-sectional illustration after a solder resist layer is formed over the dielectric layer, in accordance with an embodiment.

Referring now to FIG. 4I, a cross-sectional illustration of after a solder resist layer 460 is formed is shown, in accordance with an embodiment. Embodiments include forming the solder resist layer 460 over the fourth layer 450 and the sixth conductive layer 416. However, it is to be appreciated that any number of layers of dielectric layers and conductive layers may be formed between the magnetic second layer 425 and the solder resist layer 460. In an embodiment, the solder resist layer 460 may be formed with any suitable process. For example, the solder resist layer 460 may be formed with a lamination process.

Figure 4J:
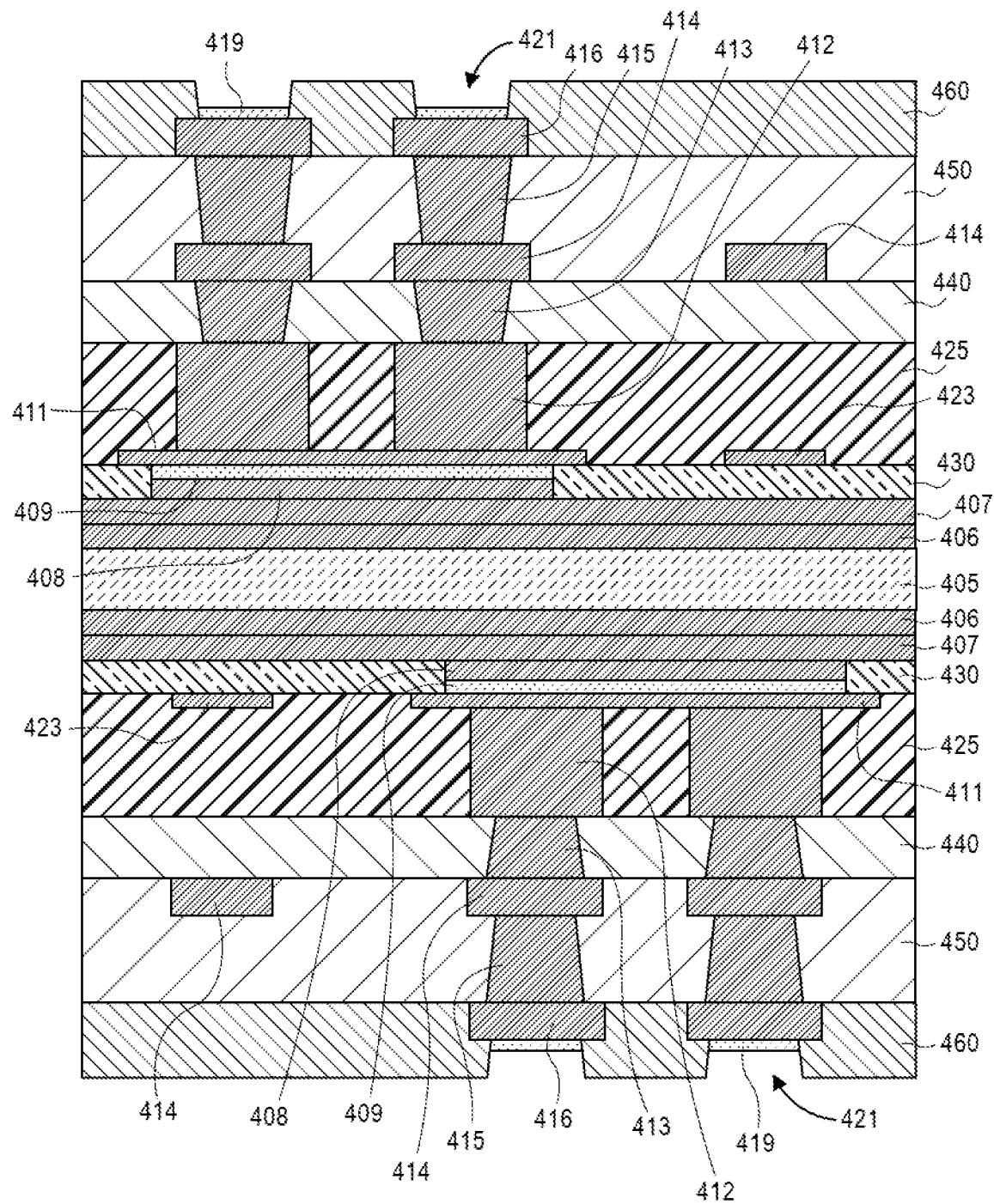
FIG. 4J is a cross-sectional illustration after openings are formed in the solder resist layer, in accordance with an embodiment.

Referring now to FIG. 4J, a cross-sectional illustration after openings 421 are formed through the solder resist layer is shown, in accordance with an embodiment. In an embodiment, the solder resist openings 421 may be formed with any suitable process, such as laser drilling, or the like. In an embodiment, a plasma cleaning may be implemented after the solder resist openings 421 are formed. Additionally, a surface finish 419 may be applied to the exposed surfaces of the sixth conductive layer 416.

Figure 4K:
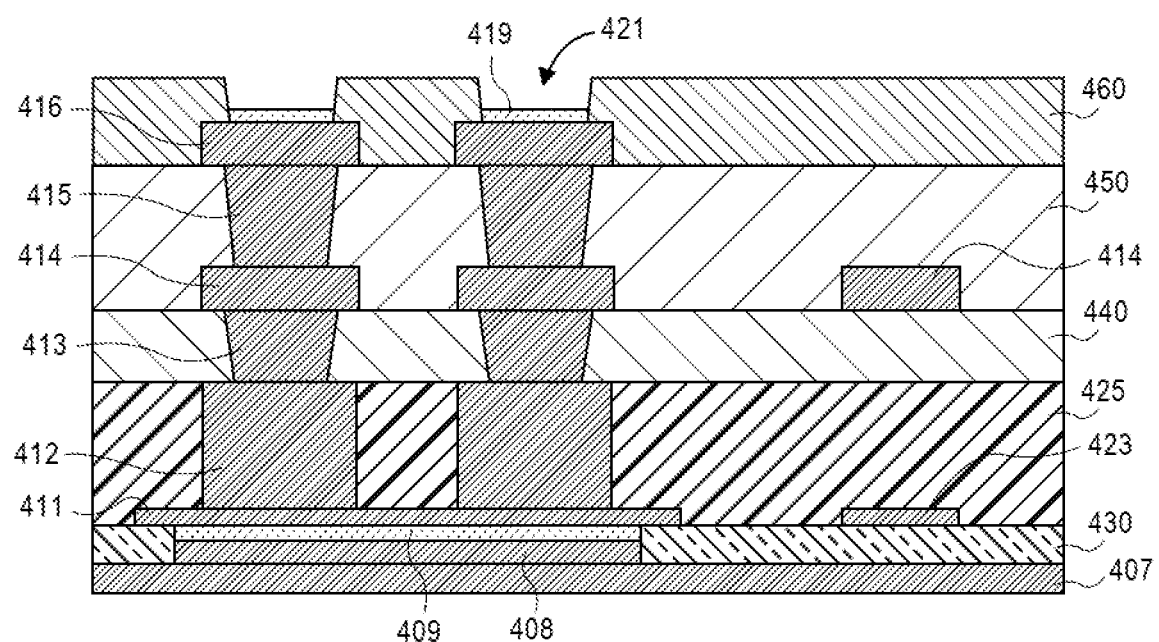
FIG. 4K is a cross-sectional illustration after the dummy core is removed, in accordance with an embodiment.

Referring now to FIG. 4K, a cross-sectional illustration after the dummy core 405 is removed is shown, in accordance with an embodiment. In an embodiment, the dummy core 405 may be detached with any suitable detaching process. As illustrated, the detach process may result in the film 407 remaining on the underside of the package. In FIG. 4K a single package is shown. However, it is to be appreciated that the dummy core detach results in both the top-side package and the bottom-side package being released. From here on in the Figures, only one of the detached packages is illustrated for clarity.

Figure 4L:
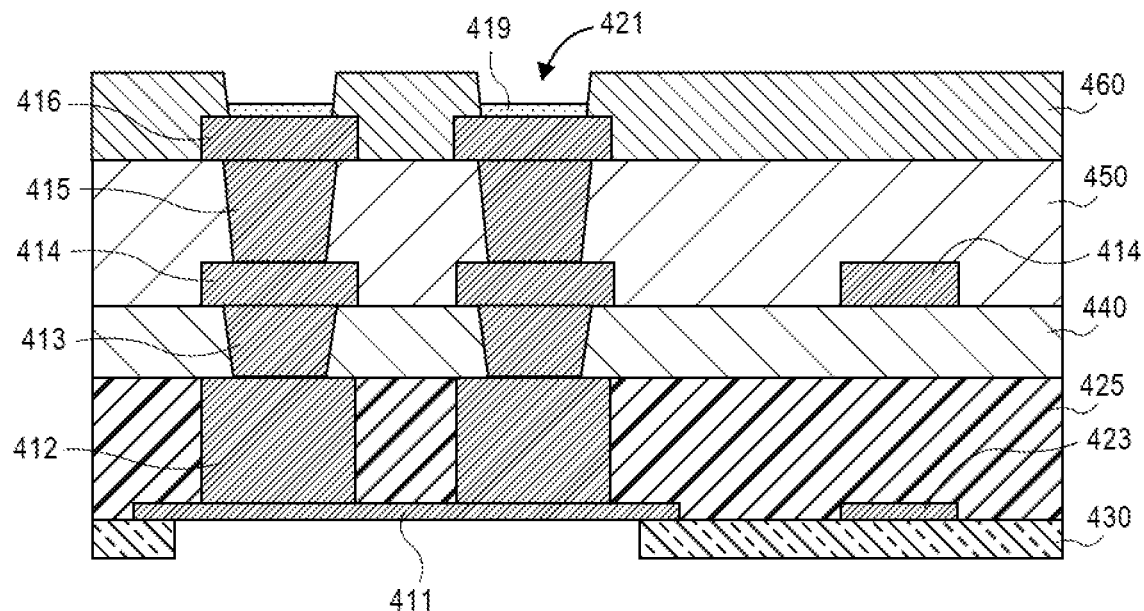
FIG. 4L is a cross-sectional illustration after an underlying conductive layer from the dummy core is removed, in accordance with an embodiment.

Referring now to FIG. 4L, a cross-sectional illustration after the film 407 and the underlying conductive layer 408 are removed is shown, in accordance with an embodiment. In an embodiment, the film 407 and the underlying layer may be removed with a wet etching process. The conductive layers (e.g., the first conductive layer 411) may be protected from the wet etch by protective layer 409, which functions as an etch stop layer. In an embodiment that includes protective layer 409, the protective layer may then be removed with an etching process that selectively removes the protective layer 409 without significantly etching away the first conductive layer 411.

Figure 4M:
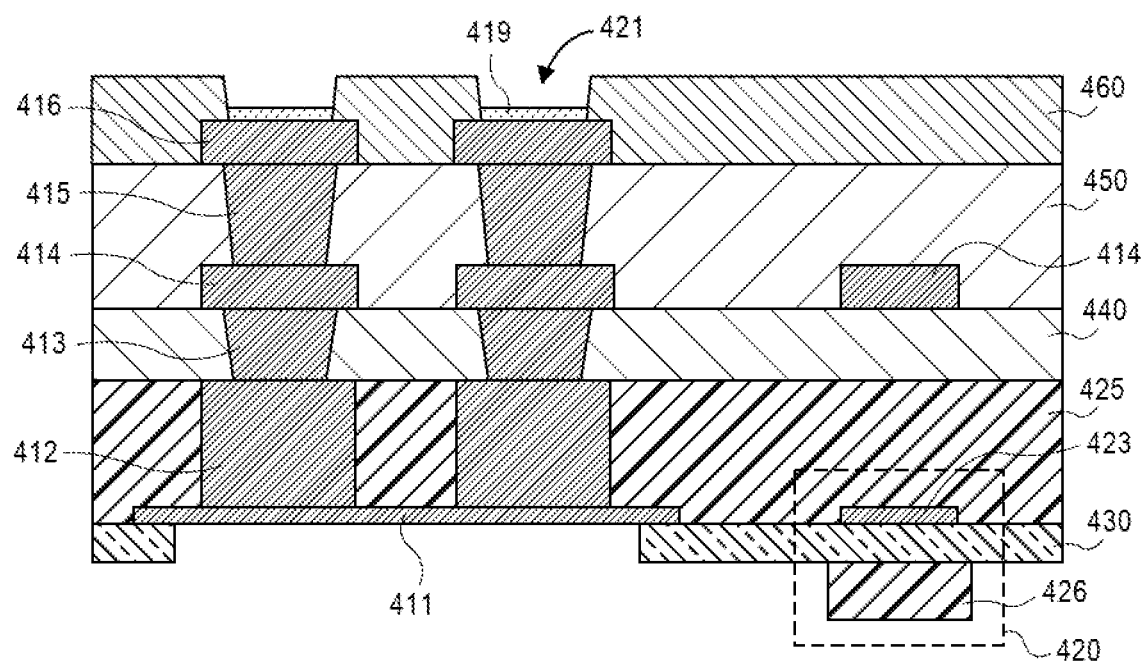
FIG. 4M is a cross-sectional illustration after a magnetic material is deposited over a surface of the PID layer in order to form an inductor surrounded by magnetic material, in accordance with an embodiment.

Referring now to FIG. 4M, a cross-sectional illustration after a magnetic block 426 is formed is shown, in accordance with an embodiment. In an embodiment, the magnetic block 426 may be formed with a printing process. As such, there is no need for etching a magnetic material to form the magnetic block 426. In an embodiment, the magnetic block 426 may be a portion of a passive device 420 integrated into the package. In an embodiment, the passive device 420 may be an inductor. In the illustrated embodiment, the inductor 420 may include a conductive traces 423 that is surrounded by magnetic material from the second layer 425 and the magnetic block 426. In an embodiment, the inductor may be a transmission line inductor, a spiral inductor, or a solenoid inductor.

Figure 5A:
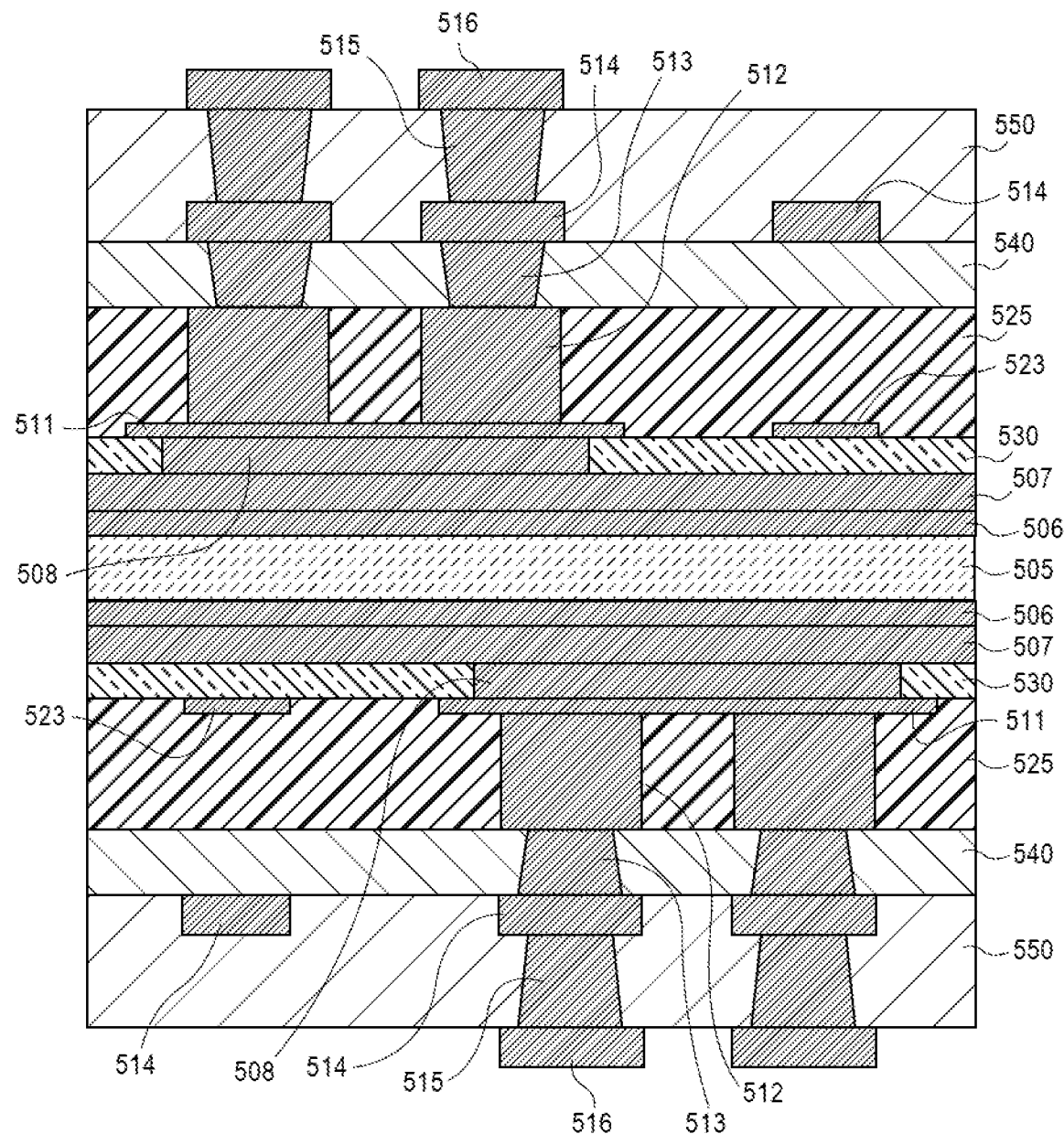
FIG. 5A is a cross-sectional illustration of a package with a magnetic layer on a dummy core, in accordance with an embodiment.

Referring now to FIGS. 5A-5F, a series of cross-sectional illustrations of a process for forming an electronic package with an integrated magnetic material is shown, in accordance with an embodiment. Referring now to FIG. 5A, a cross-sectional illustration of an electronic package being fabricated, is shown in accordance with an embodiment. The package in FIG. 5A is substantially similar to the package illustrated in FIG. 4H, and the processing operations used to get to this point in the process flow will not be repeated here. In an embodiment, FIG. 5A may differ from FIG. 4H with respect to the underlying layer 408. For example, in FIG. 5A there is no protection layer 409 between the underlying layer 408 and the first layer 511.

Figure 5B:
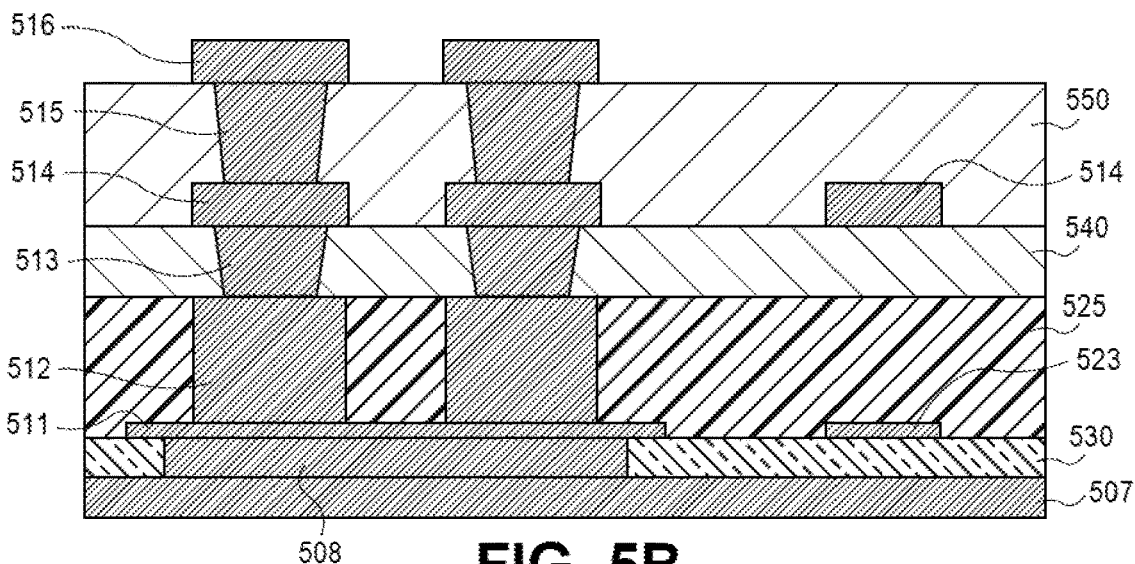
FIG. 5B is a cross-sectional illustration of the package after the dummy core is removed, in accordance with an embodiment.

Referring now to FIG. 5B, a cross-sectional illustration after the dummy core 505 is removed is shown, in accordance with an embodiment. In an embodiment, the dummy core 505 may be detached with any suitable detaching process. As illustrated, the detach process may result in the film 507 remaining on the underside of the package. In FIG. 5B a single package is shown. However, it is to be appreciated that the dummy core detach results in both the top-side package and the bottom-side package being released. From here on in the Figures, only one of the detached packages is illustrated for clarity.

Figure 5C:
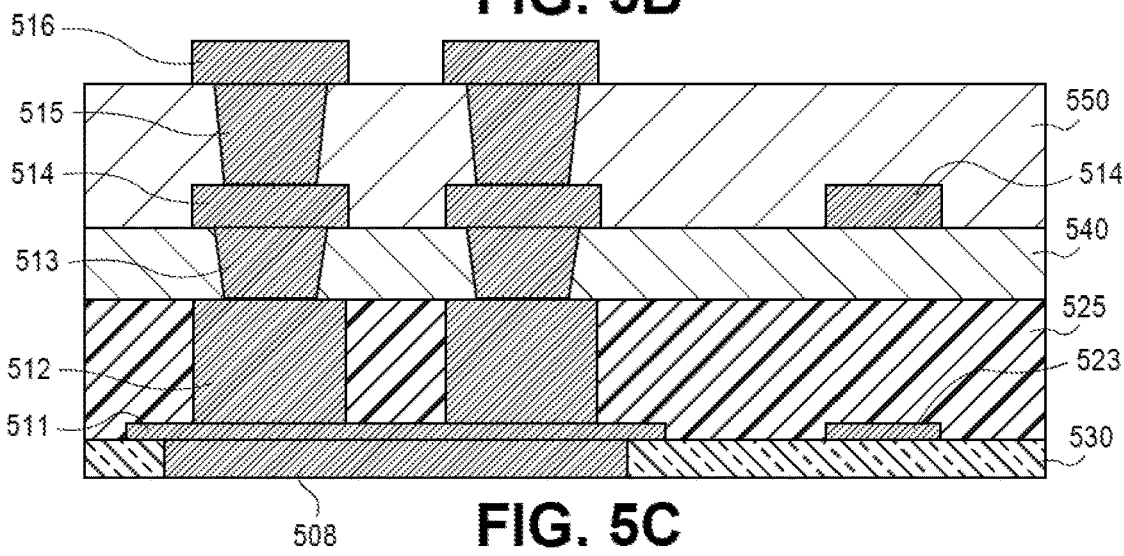
FIG. 5C is a cross-sectional illustration after an underlying conductive layer from the dummy core is removed.

Referring now to FIG. 5C, a cross-sectional illustration after the film 507 is removed is shown, in accordance with an embodiment. In an embodiment, the film 507 and the underlying layer may be removed with a wet etching process.

Figure 5D:
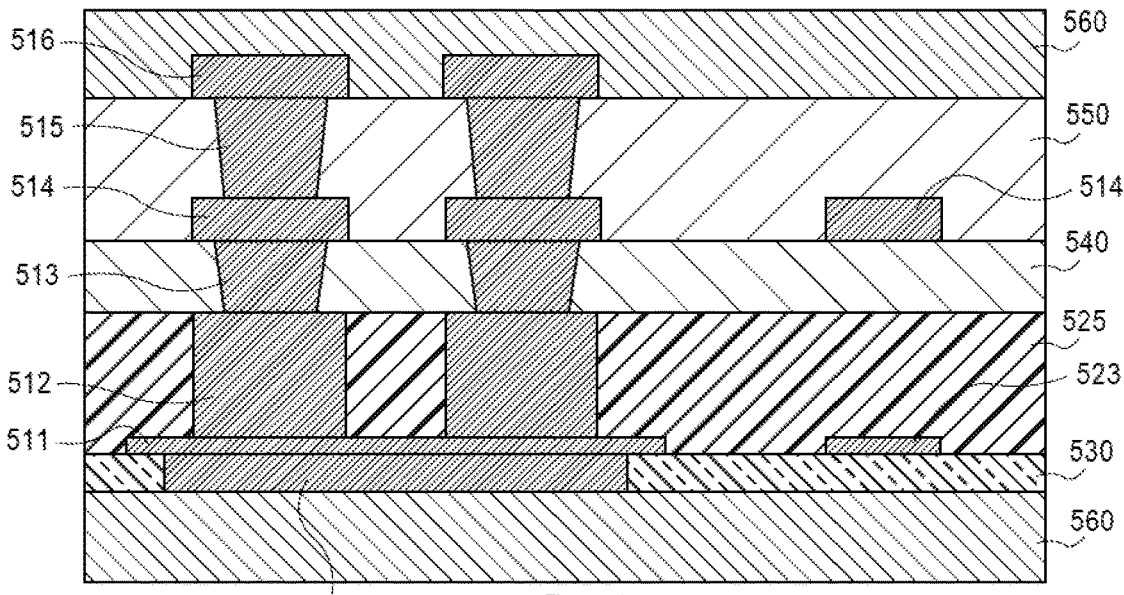
FIG. 5D is a cross-sectional illustration after solder resist layers are formed over surfaces of the package, in accordance with an embodiment.

Referring now to FIG. 5D, a cross-sectional illustration after a solder resist layer 560 is formed over a top surface and a bottom surface of the package is shown, in accordance with an embodiment. Embodiments include forming a first solder resist layer 560 over the fourth layer 550 and the sixth conductive layer 516, and forming a second solder resist layer 560 over the first layer 530 and the underlying layer 508. However, it is to be appreciated that any number of layers of dielectric layers and conductive layers may be formed between the magnetic second layer 525 and the solder resist layer 560. In an embodiment, the solder resist layers 560 may be formed with any suitable process. For example, the solder resist layer 560 may be formed with a lamination process.

Figure 5E:
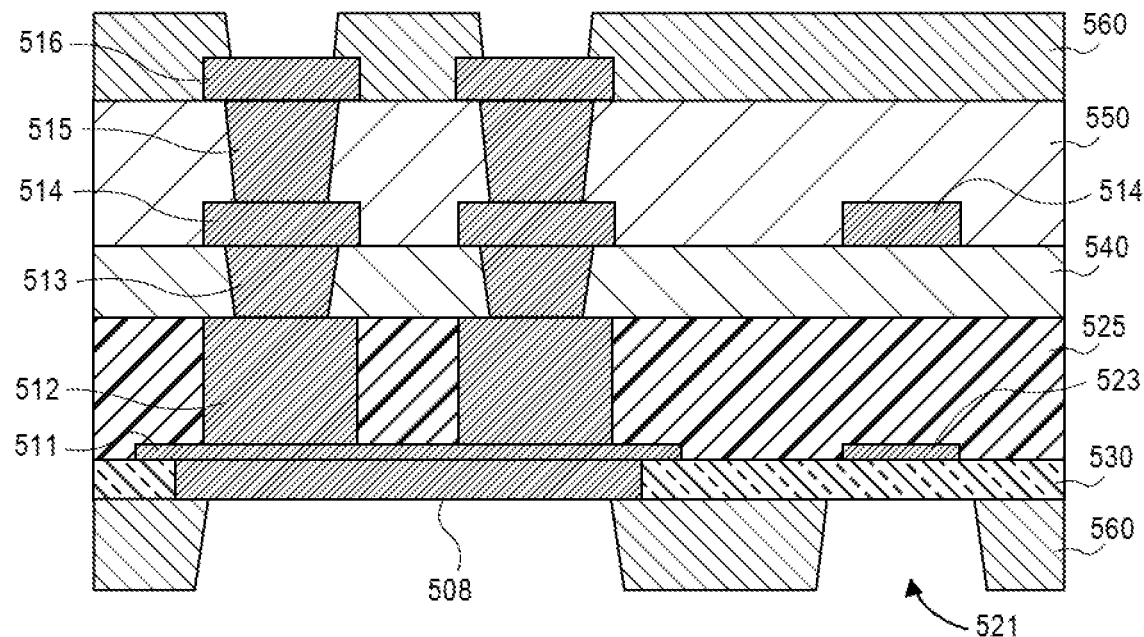
FIG. 5E is a cross-sectional illustration after openings are formed into the solder resist layers, in accordance with an embodiment.

Referring now to FIG. 5E, a cross-sectional illustration after openings 521 are formed through the solder resist layers 560 is shown, in accordance with an embodiment. In an embodiment, the solder resist openings 521 may be formed with any suitable process, such as laser drilling, or the like. The solder resist openings 521 may be formed through the solder layers 560 to expose portions of conductive layers (e.g., the sixth conductive layer 516 and the underlying layer 508). In an additional embodiment, an opening 521 may also be formed through solder resist layer 560 to expose a portion of the first layer 530. For example, an opening 521 may be formed to expose a portion of the first layer 530 proximate to the passive device trace 523.

Figure 5F:
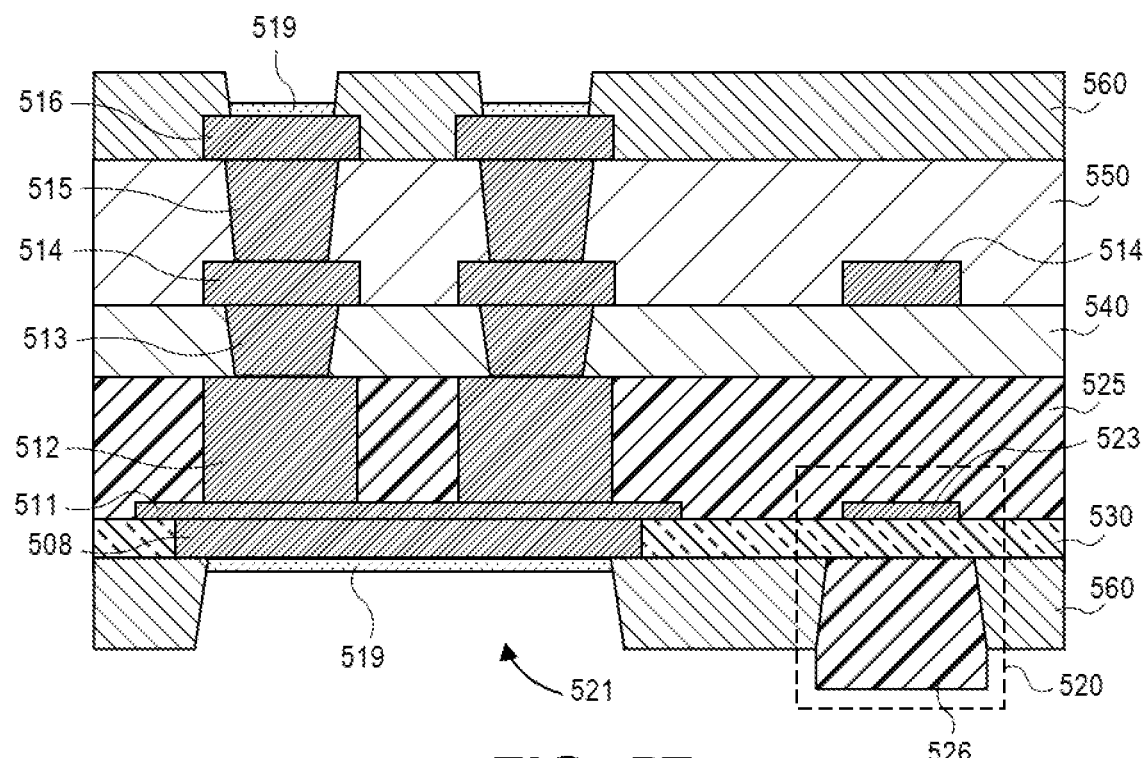
FIG. 5F is a cross-sectional illustration after a magnetic material is deposited over a surface of the PID layer to form an inductor surrounded by magnetic material, in accordance with an embodiment.

Referring now to FIG. 5F, a cross-sectional illustration after a magnetic block 526 is formed is shown, in accordance with an embodiment. In an embodiment, the magnetic block 526 may be formed with a printing process. As such, there is no need for etching a magnetic material to form the magnetic block 526. In an embodiment, the magnetic block 526 may be a portion of a passive device 520 integrated into the package. In an embodiment, the passive device 520 may be an inductor. In the illustrated embodiment, the inductor 520 may include a conductive trace 523 that is surrounded by magnetic material from the second layer 525 and the magnetic block 526. In an embodiment a surface finish 519 may be applied to the exposed surfaces of the sixth conductive layer 516 and the underlying layer 508. In an embodiment, the inductor may be a transmission line inductor, a spiral inductor, or a solenoid inductor.

Figure 6A:
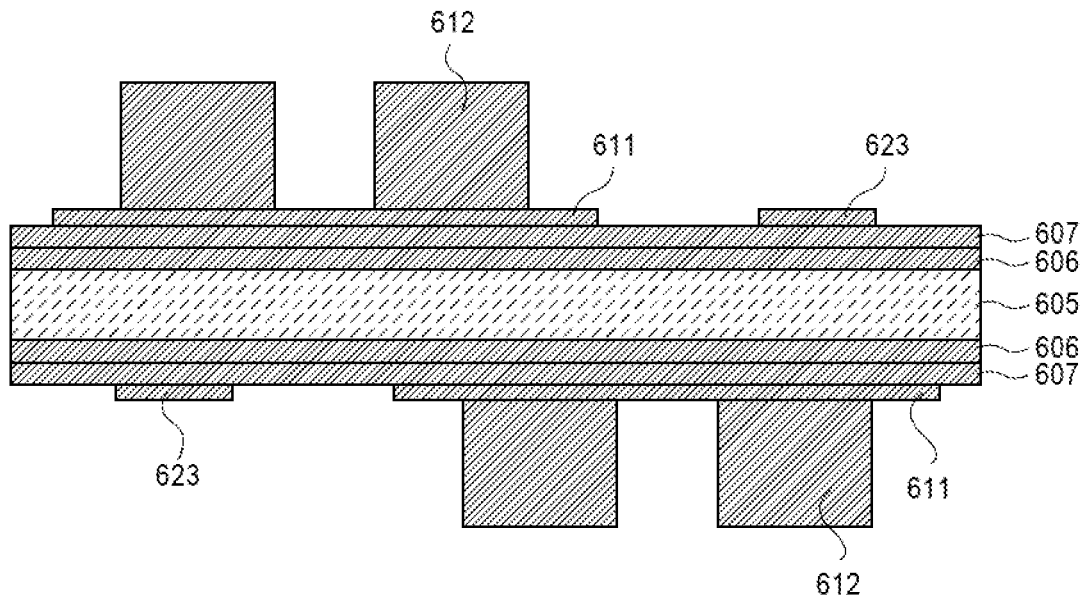
FIG. 6A is cross-sectional illustration of a dummy core with a first and second conductive layer formed with a lithography process, in accordance with an embodiment.

Referring now to FIGS. 6A-6I, cross-sectional illustrations of a process flow for forming an electronic package with an embedded magnetic layer is shown, in accordance with an embodiment. Referring now to FIG. 6A, a cross-sectional illustration of a dummy core 605 after first and second conductive layers 611 and 612 are formed is shown, in accordance with an embodiment. In an embodiment, the dummy core 605 may include film layers 606 and 607. The first conductive layer 611 may then be formed over the films 607. In an embodiment the first conductive layer 611 may include conductive traces and pads. For example, the first conductive layer 611 may include a conductive trace 623 for use in a passive component. The second conductive layer 612 may be formed over the first conductive layer. The second conductive layer 612 may include conductive pillars. The first and second conductive layers 611 and 612 may be formed with a lithography process. As such, sidewalls of the first and second conductive layers 611 and 612 may be substantially vertical.

Figure 6B:
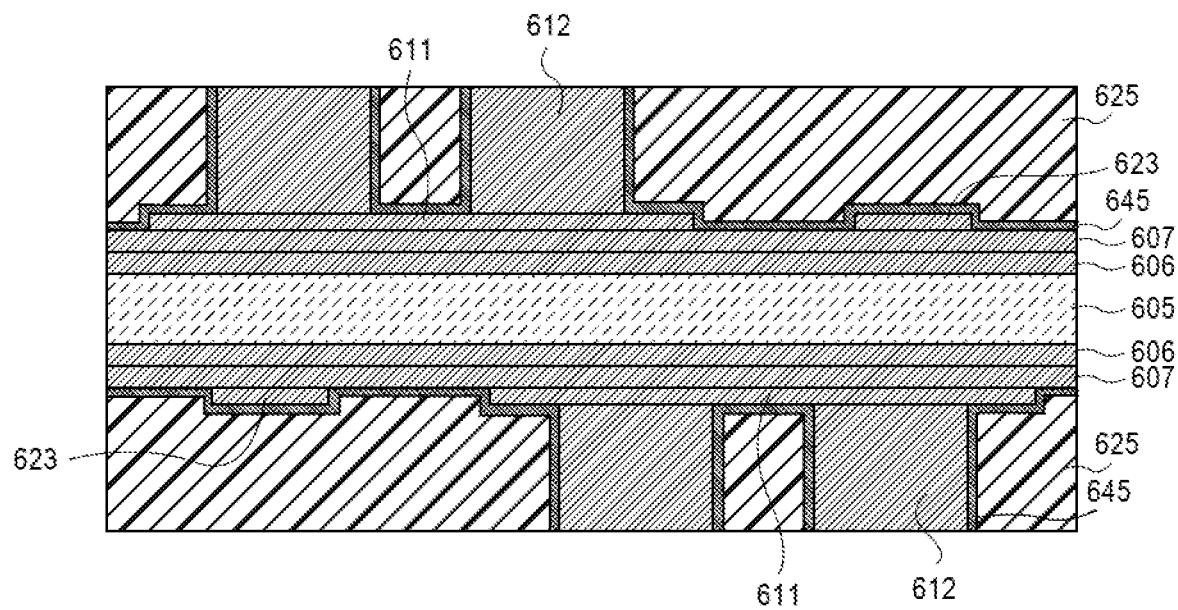
FIG. 6B is a cross-sectional illustration after a first barrier layer is formed over the surfaces of the first and second conductive layers and a magnetic layer is formed, in accordance with an embodiment.

Referring now to FIG. 6B, a cross-sectional illustration after a first barrier layer 645 and a magnetic layer 625 are formed over the first and second layer 611 and 612 is shown, in accordance with an embodiment. In an embodiment, the first barrier layer 645 may be a conformal layer over the conductive layers. For example, the first barrier layer 645 may be formed in direct contact with sidewalls and planar surfaces of the first conductive layer 611 and the second conductive layer 612.

After the first barrier layer 645 is formed, a magnetic layer 625 may be formed over the first barrier layer 645. In an embodiment, the magnetic layer 625 may comprise a dielectric material with magnetic filler particles. In an embodiment, the magnetic layer 625 may be laminated over the first barrier layer 645 or it may be deposited as a liquid and cured. In an additional embodiment, the first barrier layer 645 may be laminated over a surface of the magnetic layer 625 prior to them being deposited onto the package. In such embodiments, the combined stack of the first barrier layer 645 and the magnetic layer 625 may be laminated over the conductive layers with a single process. In an embodiment, the magnetic layer 625 may be deposited to have a thickness above a top surface of the second conductive layer 612, and then be planarized with a top surface of the second conductive layer 612.

Figure 6C:
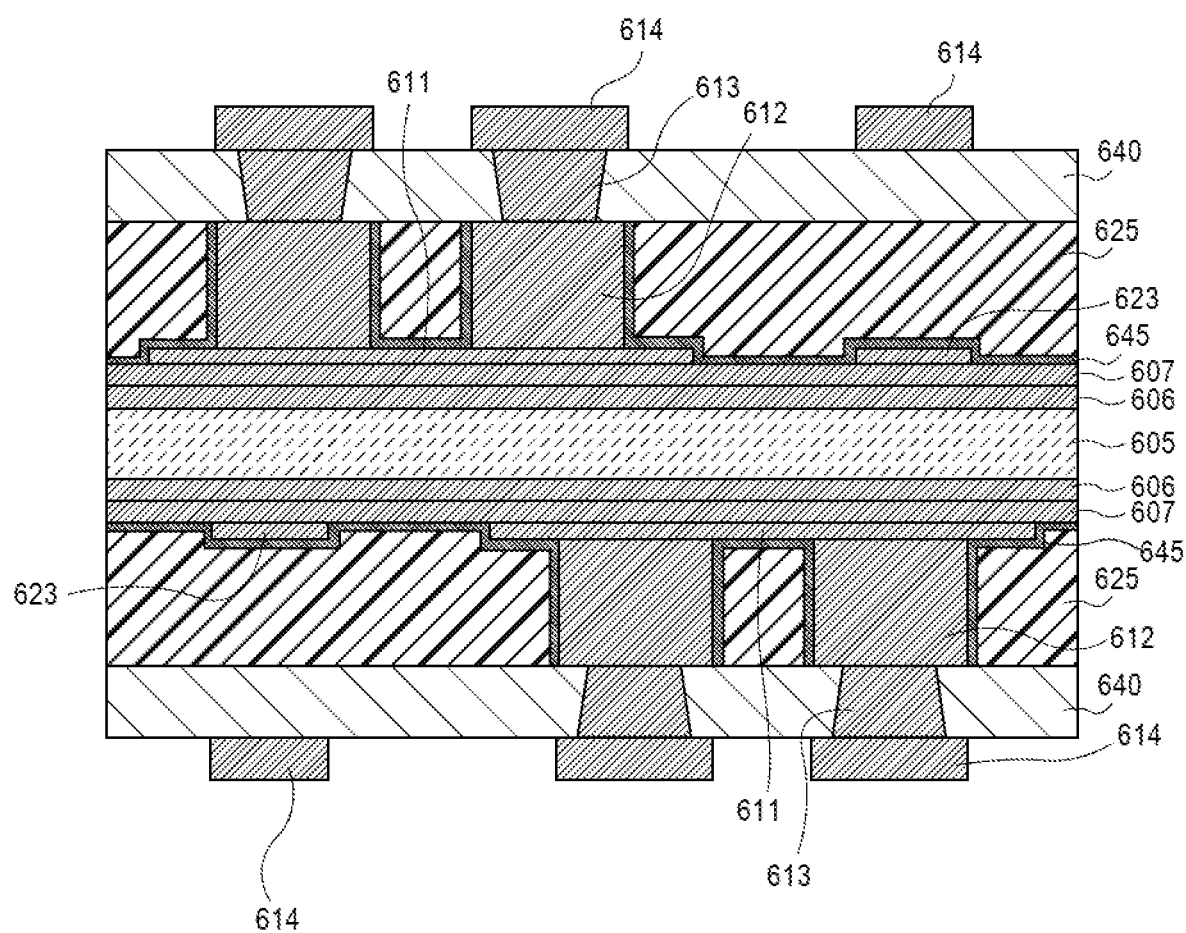
FIG. 6C is a cross-sectional illustration after a second barrier layer is formed over surfaces of the magnetic layer, in accordance with an embodiment.

Referring now to FIG. 6C, a cross-sectional illustration after a second barrier layer 640 is formed is shown, in accordance with an embodiment. In an embodiment, the second barrier layer 640 may comprise a dielectric material. Some embodiments may include a second barrier layer 640 that is a PID. In an embodiment, the second barrier layer 640 may be formed with a lamination process or any other suitable deposition process. The second barrier layer 640 may be formed over and in direct contact with the magnetic layer 625. As such, after the formation of the second barrier layer 640, the magnetic layer 625 is completely embedded and protected from subsequent processing environments. Particularly, embodiments include a magnetic second layer 625 that is in direct contact with the first barrier layer 645 and the second barrier layer 640.

In an embodiment, a third conductive layer 613 may be formed through the second barrier layer 640. For example, the third conductive layer 613 may comprise a plurality of vias. The via openings may be formed with any suitable process, such as laser drilling or photolithography. In embodiments where laser drilling is used, a desmear process may also be needed. However, since the magnetic layer 645 is protected by the second barrier layer 640, there is no contamination issue, as described above. Similarly, the third conductive layer 613 may be plated (e.g., with an electroless or electrolytic plating process) without contamination issues.

In an embodiment, a fourth conductive layer 614 may be formed over a surface of the second barrier layer 640. The fourth conductive layer 614 may be formed with any suitable processes, such as electroless or electrolytic plating, photolithography processes, or the like. The fourth conductive layer 614 may include conductive traces and pads, such as pads formed over the third conductive layer 613.

Figure 6D:
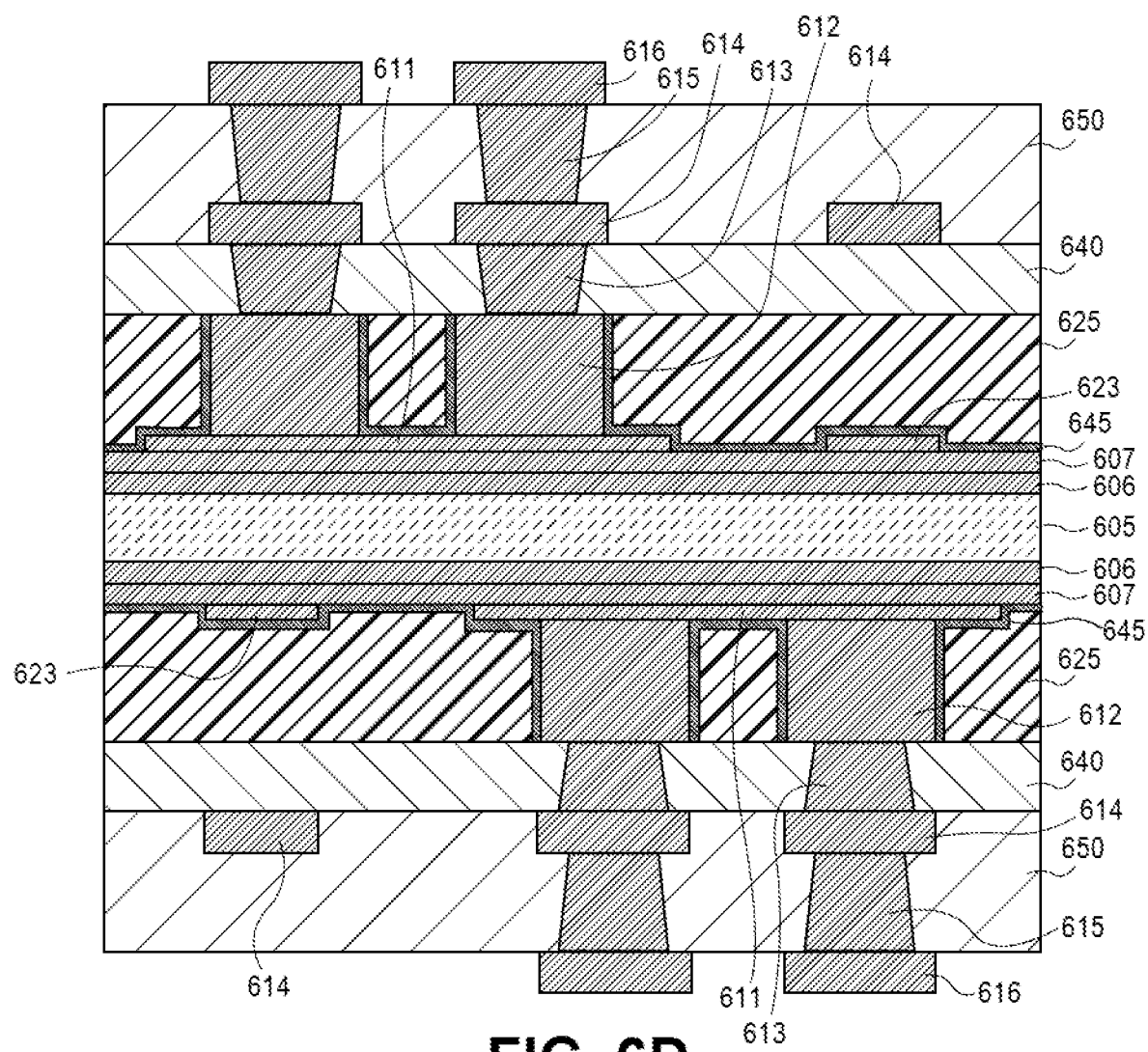
FIG. 6D is a cross-sectional illustration after a dielectric layer is formed over the second barrier layer, in accordance with an embodiment.

Referring now to FIG. 6D, a cross-sectional illustration after a buildup layer 650 is formed is shown, in accordance with an embodiment. In an embodiment, the buildup layer 650 may comprise a dielectric material. In an embodiment, the buildup layer 650 may be a different material than the barrier layer 640. In some embodiments, the buildup layer 650 may be the same material as the second barrier layer 640. Embodiments include forming a fifth conductive layer 615 in the buildup layer 650. The fifth conductive layer 615 may include conductive vias. For example, the fifth conductive layer 615 and the buildup layer 650 may be formed with typical semi-additive processes (SAP), additive processes, or any other suitable process. In an embodiment, a sixth conductive layer 616 may be formed over the top surface of the buildup layer 650. The sixth conductive layer 616 may include conductive pads and traces. The sixth conductive layer may be formed with any suitable process, such as an additive process, a SAP process, or the like. It is to be appreciated that since the magnetic layer 625 is protected by the barrier layer 640, there is no contamination issue during the processes used to form the buildup layer 650 or any of the conductive layers.

Figure 6E:
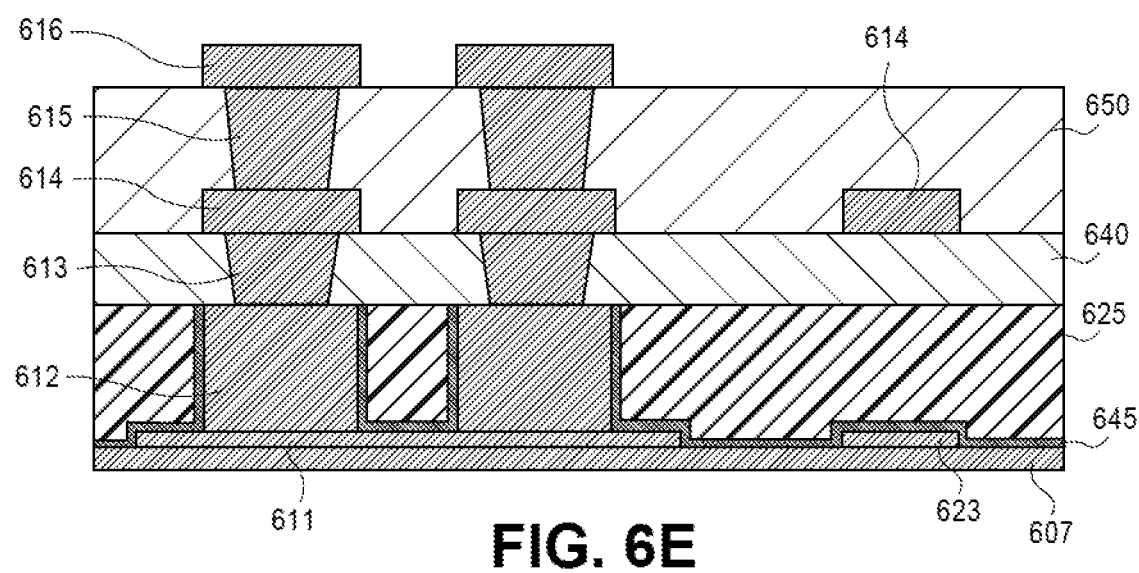
FIG. 6E is a cross-sectional illustration after the dummy core is removed, in accordance with an embodiment.

Referring now to FIG. 6E, a cross-sectional illustration after the dummy core 605 is removed is shown, in accordance with an embodiment. In an embodiment, the dummy core 605 may be detached with any suitable detaching process. As illustrated, the detach process may result in the film 607 remaining on the underside of the package. In FIG. 6E a single package is shown. However, it is to be appreciated that the dummy core detach results in both the top-side package and the bottom-side package being released. From here on in the Figures, only one of the detached packages is illustrated for clarity.

Figure 6F:
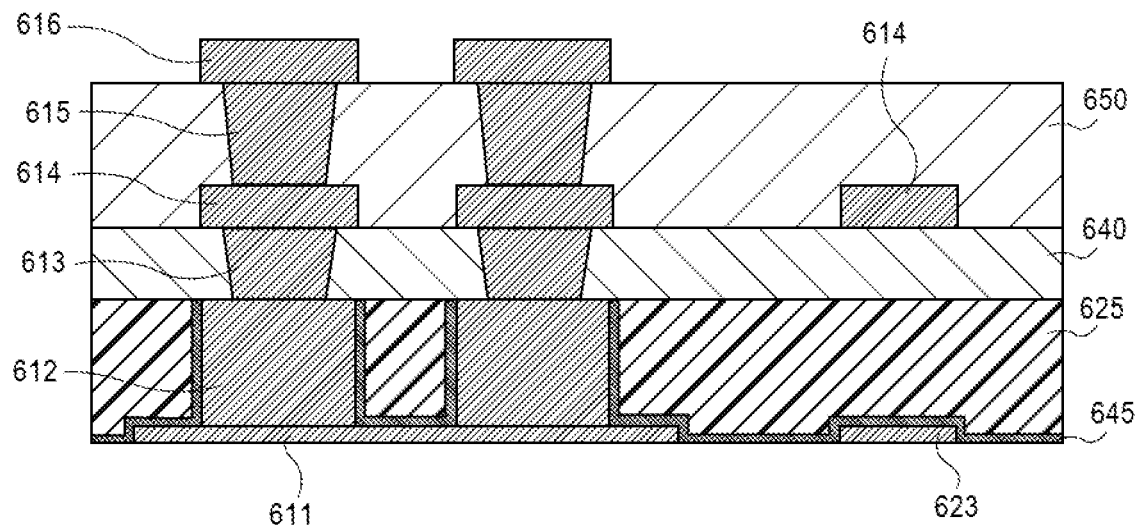
FIG. 6F is a cross-sectional illustration after an underlying conductive layer from the dummy core is removed, in accordance with an embodiment.

Referring now to FIG. 6F, a cross-sectional illustration after the film 607 is removed is shown, in accordance with an embodiment. In an embodiment, the film 607 may be removed with a wet etching process. As shown, the removal of the film 607 results in the exposure of the first conductive layer 611 and portions of the first barrier layer 645. The first barrier layer 645 protects the magnetic layer 625 from the processing environments and prevents contamination of etching baths.

Figure 6G:
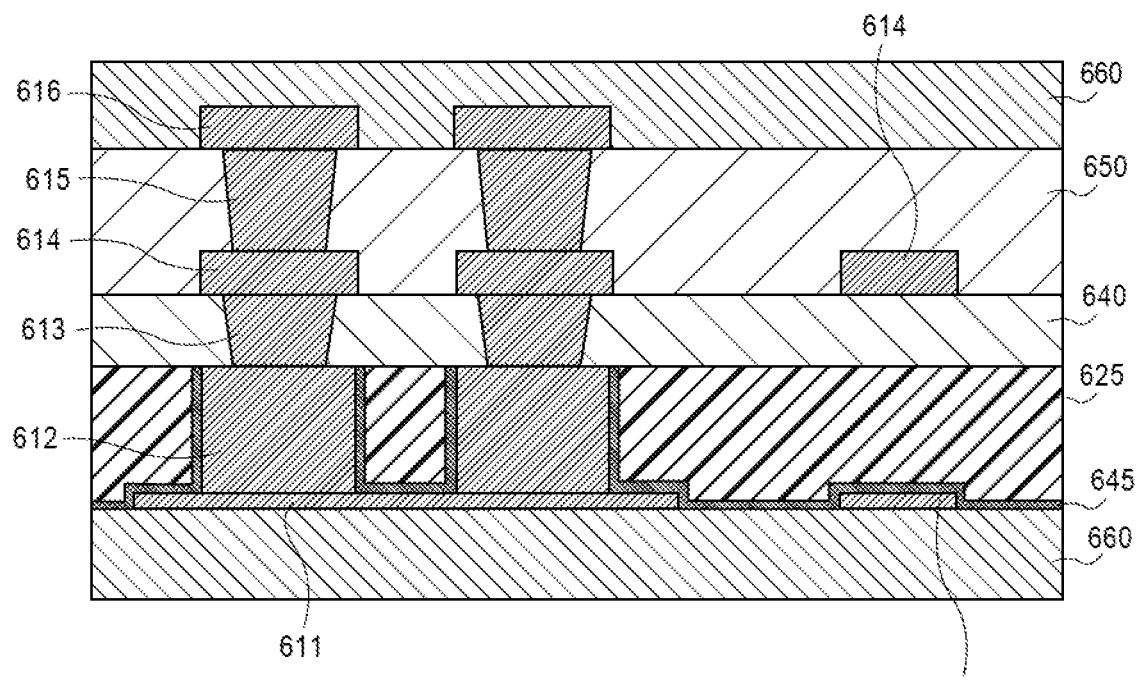
FIG. 6G is a cross-sectional illustration after a solder resist layers are formed over exposed surfaces, in accordance with an embodiment.

Referring now to FIG. 6G, a cross-sectional illustration after a solder resist layer 660 is formed over a top surface and a bottom surface of the package is shown, in accordance with an embodiment. Embodiments include forming a first solder resist layer 660 over the buildup layer 650 and the sixth conductive layer 616, and forming a second solder resist layer 660 over the first conductive layer 611 and the first barrier layer 645. However, it is to be appreciated that any number of layers of dielectric layers and conductive layers may be formed between the magnetic layer 625 and the solder resist layer 660. In an embodiment, the solder resist layers 660 may be formed with any suitable process. For example, the solder resist layer 660 may be formed with a lamination process.

Figure 6H:
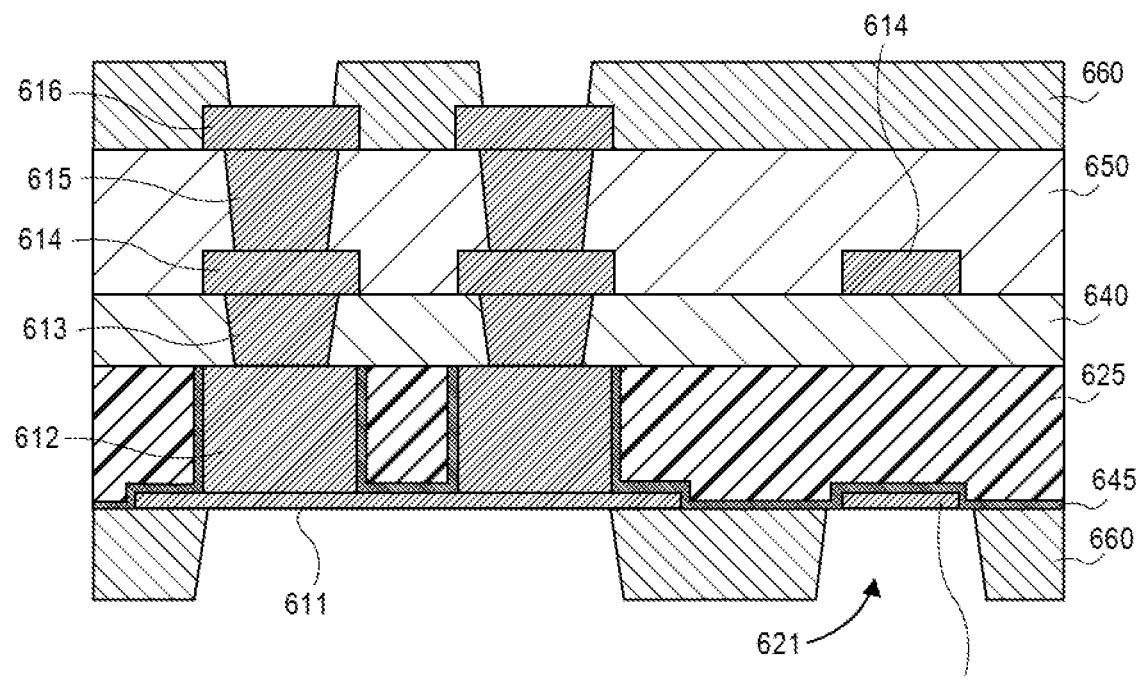
FIG. 6H is a cross-sectional illustration after openings are formed in the solder resist layers, in accordance with an embodiment.

Referring now to FIG. 6H, a cross-sectional illustration after openings 621 are formed through the solder resist layers 660 is shown, in accordance with an embodiment. In an embodiment, the solder resist openings 621 may be formed with any suitable process, such as laser drilling, or the like. The solder resist openings 621 may be formed through the solder layers 660 to expose portions of conductive layers (e.g., the sixth conductive layer 616 and the first conductive layer 611). In an additional embodiment, an opening 621 may also be formed through solder resist layer 660 to expose the passive device trace 623 and a portion of the first barrier layer 645 immediately adjacent to the passive device trace 623.

Figure 6I:
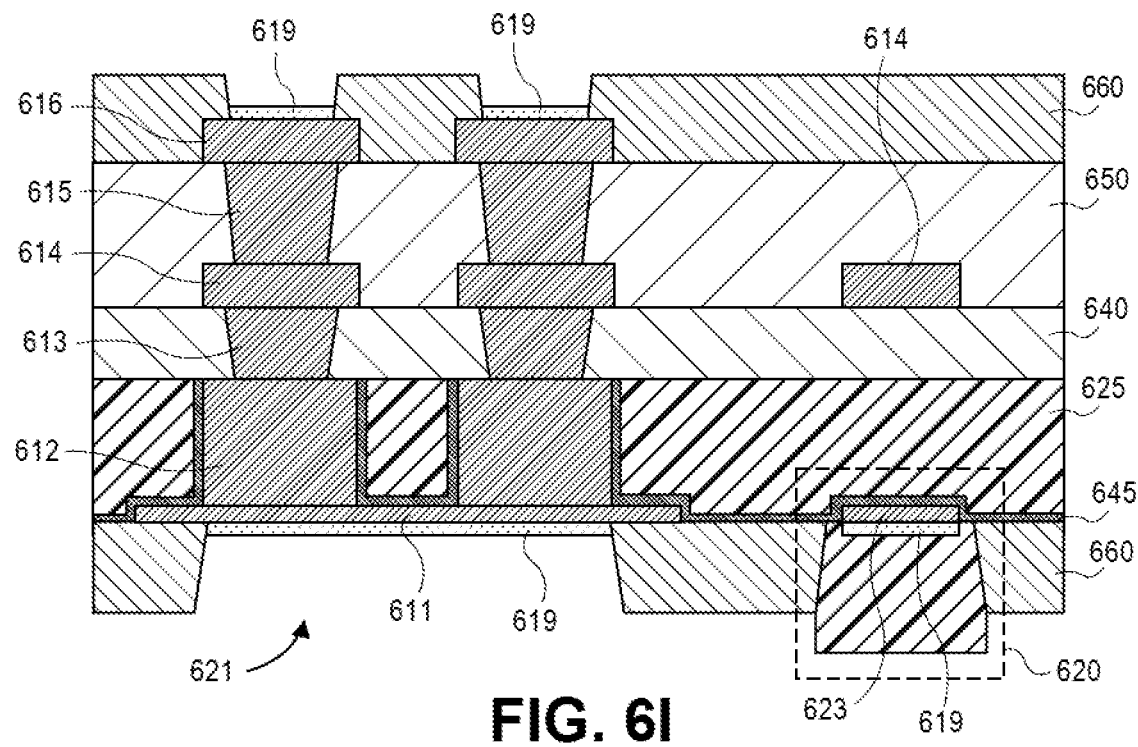
FIG. 6I cross-sectional illustration after a magnetic material is deposited into a solder resist opening to a form an inductor surrounded by magnetic material, in accordance with an embodiment.

Referring now to FIG. 6I, a cross-sectional illustration after magnetic block 626 is formed is shown, in accordance with an embodiment. In an embodiment, the magnetic block 626 may be formed with a printing process. As such, there is no need for etching a magnetic material to form the magnetic block 626. In an embodiment, the magnetic block 626 may be a portion of a passive device 620 integrated into the package. In an embodiment, the passive device 620 may be an inductor. In the illustrated embodiment, the inductor 620 may include a conductive trace 623 that is surrounded by magnetic material from the magnetic layer 625 and the magnetic block 626. In an embodiment a surface finish 619 may be applied to the exposed surfaces of the sixth conductive layer 616 the first conductive layer 611, passive device trace 623. In an embodiment, the inductor 620 may be a transmission line inductor, a spiral inductor, or a solenoid inductor.

Figure 7:
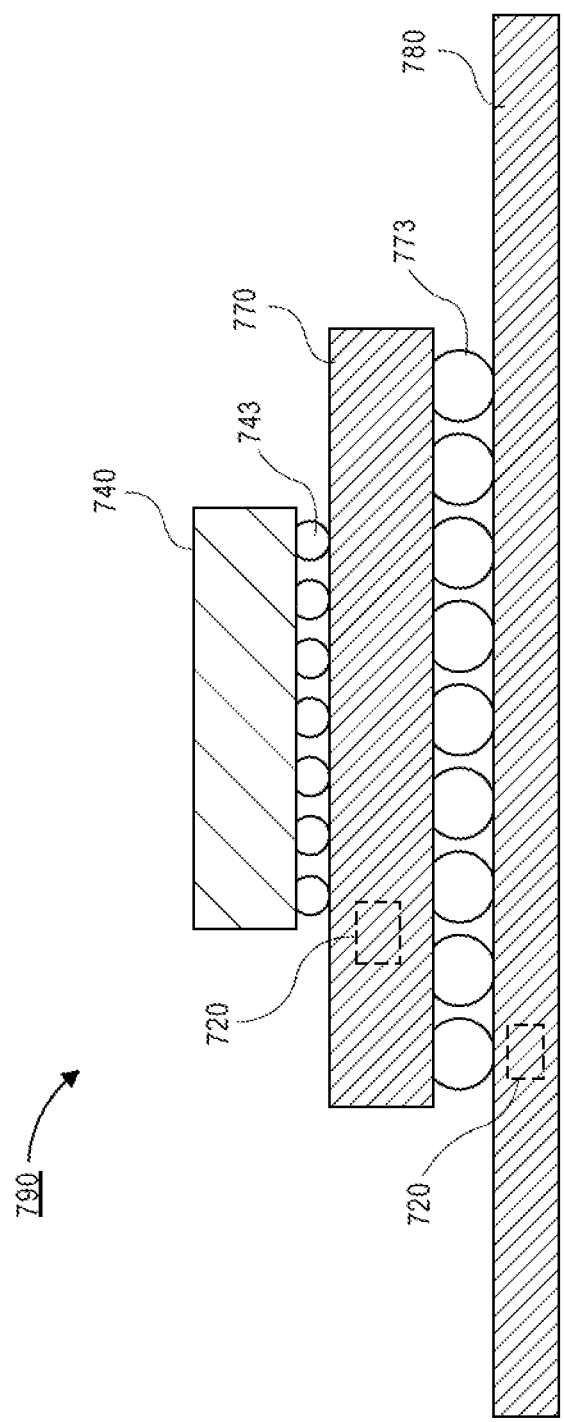
FIG. 7 is a cross-sectional illustration of an electronic package that includes an embedded magnetic material in the package substrate, in accordance with an embodiment.

Referring now to FIG. 7, a cross-sectional illustration of a packaged system 790 is shown, in accordance with an embodiment. In an embodiment, the packaged system 790 may include a die 740 electrically coupled to a package substrate 770 with solder bumps 743. In additional embodiments, the die 740 may be electrically coupled to the package substrate 770 with any suitable interconnect architecture, such as wire bonding or the like. The package substrate 770 may be electrically coupled to a board, such as a printed circuit board (PCB) with solder bumps 773 or any other suitable interconnect architecture, such as wire bonding or the like.

In an embodiment, an inductor 720 similar to embodiments described above may be integrated into the package substrate 770 or the board 780, or the package substrate 770 and the board 780. Embodiments include any number of inductors 720 formed into the package substrate 770 and the board 780. For example, a plurality of inductors 720 may be integrated into the circuitry of the package substrate 770 or the board 780, or the package substrate 770 and the board 780 for power management, filtering, or any other desired use.

Figure 8:
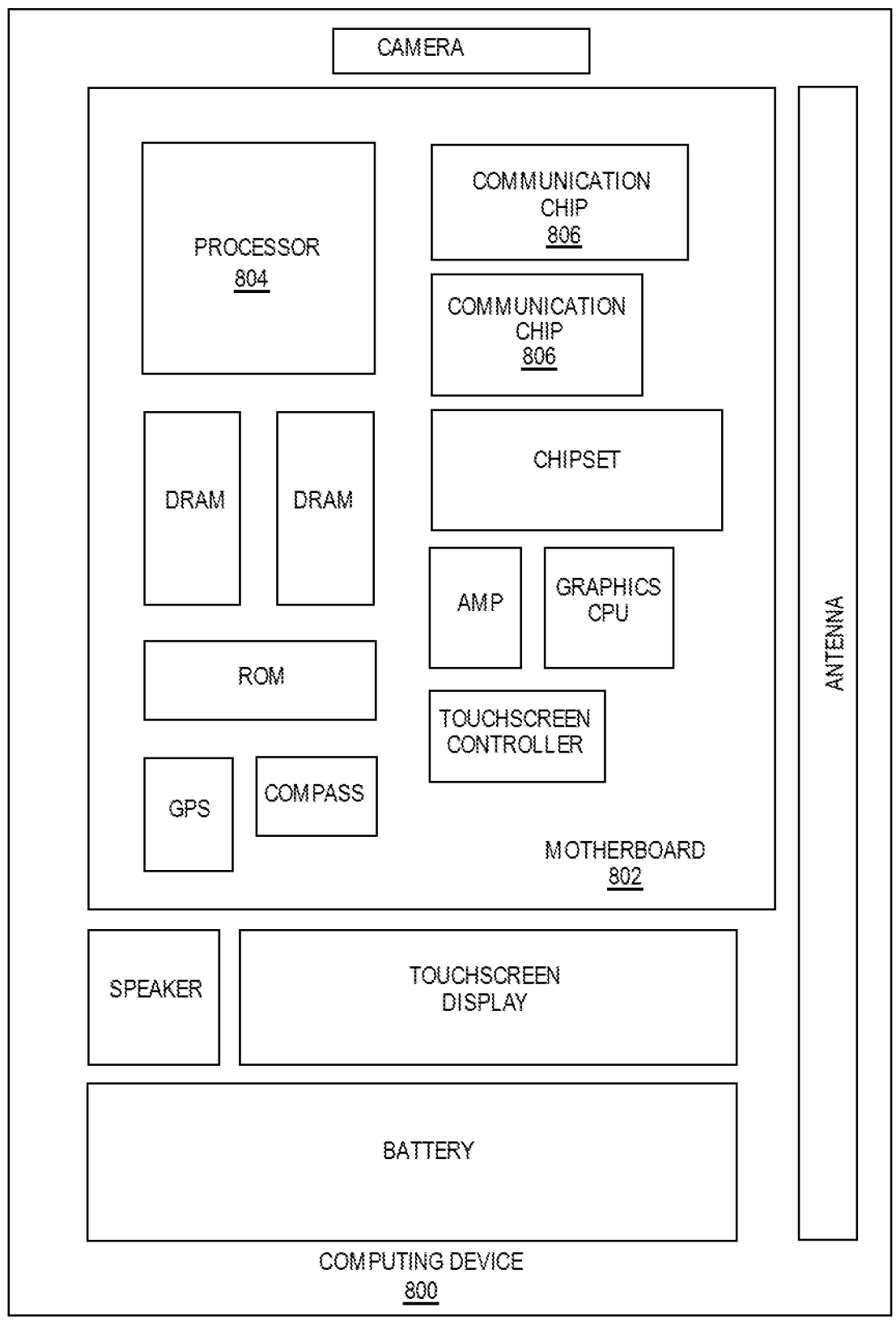
FIG. 8 is a schematic of a computing device built in accordance with an embodiment.

FIG. 8 illustrates a computing device 800 in accordance with one implementation of the invention. The computing device 800 houses a board 802. The board 802 may include a number of components, including but not limited to a processor 804 and at least one communication chip 806. The processor 804 is physically and electrically coupled to the board 802. In some implementations the at least one communication chip 806 is also physically and electrically coupled to the board 802. In further implementations, the communication chip 806 is part of the processor 804.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 806 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, Ev-DO, and others.

The processor 804 of the computing device 800 includes an integrated circuit die packaged within the processor 804. In some implementations of the invention, the integrated circuit die of the processor may be communicatively coupled to an organic electronic package that includes an inductor surrounded by magnetic material, in accordance with embodiments described herein. The term "processor" may refer to any device or portion of a device that processes electronic data from registers and/or memory to transform that electronic data into other electronic data that may be stored in registers and/or memory.

The communication chip 806 also includes an integrated circuit die packaged within the communication chip 806. In accordance with another implementation of the invention, the integrated circuit die of the communication chip may be communicatively coupled to an organic electronic package that includes an inductor surrounded by magnetic material, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1 includes an electronic package, comprising: a first layer, wherein the first layer comprises a dielectric material; a second layer over the first layer, wherein the second layer comprises a magnetic material; a third layer over the second layer, wherein the third layer comprises a dielectric material, and wherein the third layer entirely covers a first surface of the second layer; and a first conductive layer and a second conductive layer embedded within the second layer, wherein sidewalls of the first conductive layer and the second conductive layer are substantially vertical.

Example 2 includes the electronic package of Example 1, wherein the first layer is a photoimageable dielectric (PID).

Example 3 includes the electronic package of Example 1 or Example 2, wherein an opening through the first layer exposes a surface of the first conductive layer.

Example 4 includes the electronic package of Examples 1-3, wherein the second conductive layer comprises a vertical pillar.

Example 5 includes the electronic package of Example 1-4, further comprising: a magnetic block formed on a surface of the first layer opposite from the second layer.

Example 6 includes the electronic package of Example 1-5, wherein the first conductive layer comprises a conductive trace between the magnetic block and the second layer.

Example 7 includes the electronic package of Example 1-6, further comprising: an inductor, wherein the inductor comprises portions of the first conductive layer, the second layer, and the magnetic block, and wherein the inductor is a transmission line inductor, a spiral inductor, or a solenoid inductor.

Example 8 includes the electronic package of Example 1-7, further comprising: a fourth layer over the third layer, wherein the fourth layer is a dielectric material.

Example 9 includes the electronic package of Example 1-8, further comprising: a third conductive layer through the third layer; a fourth conductive layer over the third layer; a fifth conductive layer in the fourth layer; and a sixth conductive layer over the fourth layer.

Example 10 includes the electronic package of Example 1-9, further comprising a first solder resist layer over the fourth layer, wherein openings are formed into the solder resist layer to expose portions of the fifth conductive layer.

Example 11 includes the electronic package of Example 1-10, further comprising: a second solder resist layer over a surface of the first layer opposite the second layer.

Example 12 includes the electronic package of Example 1-11, further comprising: a conductive layer through the first layer, wherein the second solder resist comprises an opening to expose a portion of the conductive layer.

Example 13 includes the electronic package of Example 1-12, wherein the electronic package is a coreless package.

Example 14 includes an electronic package, comprising: a first layer, wherein the first layer comprises a magnetic material; a first conductive layer and a second conductive layer embedded within the first layer; a first barrier layer along a bottom surface of the first layer and along sidewall surfaces of the first layer, wherein the first barrier layer separates the first layer from the first conductive layer and the second conductive layer; and a second barrier layer over a top surface of the first layer.

Example 15 includes the electronic package of Example 14, wherein sidewalls of the first conductive layer and the second conductive layer are substantially vertical.

Example 16 includes the electronic package of Example 14 or Example 15, wherein a thickness of the first barrier layer is less than a thickness of the second barrier layer.

Example 17 includes the electronic package of Example 14-16, further comprising: a third conductive layer through the second barrier layer; a fourth conductive layer over the second barrier layer; a buildup layer over the second barrier layer, wherein the buildup layer comprises a dielectric material; a fifth conductive layer through the buildup layer; and a sixth conductive layer over the buildup layer.

Example 18 includes the electronic package of Example 14-17, further comprising: a first solder resist layer over the buildup layer; and a second solder resist layer contacting a portion of the first barrier layer.

Example 19 includes the electronic package of Example 14-18, further comprising: a magnetic block formed on through an opening in the second solder resist layer; and an inductor comprising portions of the first conductive layer, the first layer, and the magnetic block.

Example 20 includes the electronic package of Example 14-19, wherein the electronic package is a coreless package.

Example 21 includes a method of forming an electronic package, comprising: forming a first conductive layer over a dummy core; forming a second conductive layer over the first conductive layer with a lithographic process; forming a first barrier layer over exposed surfaces of the first conductive layer, the second conductive layer, and the dummy core; forming a first layer over the first barrier layer, wherein the first layer comprises a magnetic material, and wherein a top surface of the first layer is substantially coplanar with a top surface of the second conductive layer; and forming a second barrier layer over the first layer and the second conductive layer, wherein the first barrier layer and the second barrier layer entirely surround portions of the first layer.

Example 22 includes the method of claim 21, wherein the first layer and the first barrier layer are laminated together prior to being disposed over exposed surfaces of the first conductive layer, the second conductive layer, and the dummy core.

Example 23 includes the method of Example 21 or Example 22, wherein a portion of the first layer forms a portion of an inductor in the electronic package.

Example 24 includes an electronic package, comprising: a coreless package substrate, wherein the coreless package substrate includes a magnetic layer, wherein portions of the magnetic layer are entirely surrounded by a first barrier layer and second barrier layer; and a die affixed to the coreless package.

Example 25 includes the electronic package of Example 24, further comprising: an inductor on or embedded in the coreless package substrate, wherein at least a portion of the inductor includes the portions of the magnetic layer that is entirely surrounded by the first barrier layer and the second barrier layer.

What is claimed is:

1. A method of forming an electronic package, comprising:
    forming a first conductive layer over a dummy core;
    forming a second conductive layer over the first conductive layer with a lithographic process;
    forming a first barrier layer over exposed surfaces of the first conductive layer, the second conductive layer, and the dummy core;
    forming a first layer over the first barrier layer, wherein the first layer comprises a magnetic material, and wherein a top surface of the first layer is substantially coplanar with a top surface of the second conductive layer; and
    forming a second barrier layer over the first layer and the second conductive layer, wherein the first barrier layer and the second barrier layer entirely surround portions of the first layer.

2. The method of claim 1, wherein the first layer and the first barrier layer are laminated together prior to being disposed over exposed surfaces of the first conductive layer, the second conductive layer, and the dummy core.

3. The method of claim 1, wherein a portion of the first layer forms a portion of an inductor in the electronic package.

4. A method of fabricating an electronic package, the method comprising:
    forming a first layer, wherein the first layer comprises a dielectric material;
    forming a second layer over the first layer, wherein the second layer comprises a magnetic material having an uppermost surface;
    forming a third layer over the second layer, wherein the third layer comprises a dielectric material, and wherein the third layer entirely covers a first surface of the second layer; and
    forming a first conductive layer and a second conductive layer embedded within the second layer, wherein sidewalls of the first conductive layer and the second conductive layer are substantially vertical, and wherein the first conductive layer and the second conductive layer have an uppermost surface horizontally co-planar with the uppermost surface of the magnetic material of the second layer.

5. The method of claim 4, wherein the first layer is a photoimageable dielectric (PID).

6. The method of claim 5, wherein an opening through the first layer exposes a surface of the first conductive layer.

7. The method of claim 4, wherein the second conductive layer comprises a vertical pillar.

8. The method of claim 4, further comprising:
    forming a magnetic block formed on a surface of the first layer opposite from the second layer.

9. The method of claim 8, wherein the first conductive layer comprises a conductive trace between the magnetic block and the second layer.

10. The method of claim 9, further comprising:
    forming an inductor, wherein the inductor comprises portions of the first conductive layer, the second conductive layer, and the magnetic block, and wherein the inductor is a transmission line inductor, a spiral inductor, or a solenoid inductor.

11. The method of claim 4, further comprising:
    forming a fourth layer over the third layer, wherein the fourth layer is a dielectric material.

12. The method of claim 11, further comprising:
    forming a third conductive layer through the third layer;
    forming a fourth conductive layer over the third layer;
    forming a fifth conductive layer in the fourth layer; and
    forming a sixth conductive layer over the fourth layer.

13. The method of claim 12, further comprising:
    forming a first solder resist layer over the fourth layer, wherein openings are formed into the solder resist layer to expose portions of the fifth conductive layer.

14. The method of claim 13, further comprising:
    forming a second solder resist layer over a surface of the first layer opposite the second layer.

15. The method of claim 14, further comprising:
    forming a conductive layer through the first layer, wherein the second solder resist comprises an opening to expose a portion of the conductive layer.

16. The method of claim 4, wherein the electronic package is a coreless package.

17. A method of fabricating an electronic package, the method comprising:
- forming a first layer, wherein the first layer comprises a magnetic material having an uppermost surface;
- forming a first conductive layer and a second conductive layer embedded within the first layer, wherein the first conductive layer and the second conductive layer have an uppermost surface horizontally co-planar with the uppermost surface of the magnetic material of the first layer;
- forming a first barrier layer along a bottom surface of the first layer and along sidewall surfaces of the first layer, wherein the first barrier layer separates the first layer from the first conductive layer and the second conductive layer; and
- forming a second barrier layer over a top surface of the first layer.

18. The method of claim 17, wherein the sidewalls of the first conductive layer and the second conductive layer are substantially vertical.

19. The method of claim 17, wherein a thickness of the first barrier layer is less than a thickness of the second barrier layer.

20. The method of claim 17, further comprising:
- forming a third conductive layer through the second barrier layer;
- forming a fourth conductive layer over the second barrier layer;
- forming a buildup layer over the second barrier layer, wherein the buildup layer comprises a dielectric material;
- forming a fifth conductive layer through the buildup layer; and
- forming a sixth conductive layer over the buildup layer.

21. The method of claim 20, further comprising:
- forming a first solder resist layer over the buildup layer; and
- forming a second solder resist layer contacting a portion of the first barrier layer.

22. The method of claim 21, further comprising:
- forming a magnetic block formed on through an opening in the second solder resist layer; and
- forming an inductor comprising portions of the first conductive layer, the first layer, and the magnetic block.

23. The method of claim 17, wherein the electronic package is a coreless package.

* * * * *